United States Patent
Chang et al.

(10) Patent No.: US 11,569,146 B2
(45) Date of Patent: Jan. 31, 2023

(54) SEMICONDUCTOR PACKAGE AND METHOD OF FORMING THE SAME

(71) Applicant: AGENCY FOR SCIENCE, TECHNOLOGY AND RESEARCH, Singapore (SG)

(72) Inventors: Ka Fai Chang, Singapore (SG); Yong Han, Singapore (SG); David Soon Wee Ho, Singapore (SG); Ying Ying Lim, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 1076 days.

(21) Appl. No.: 16/312,987

(22) PCT Filed: Jun. 8, 2017

(86) PCT No.: PCT/SG2017/050291
§ 371 (c)(1),
(2) Date: Dec. 21, 2018

(87) PCT Pub. No.: WO2017/222471
PCT Pub. Date: Dec. 28, 2017

(65) Prior Publication Data
US 2020/0185299 A1 Jun. 11, 2020

(30) Foreign Application Priority Data
Jun. 24, 2016 (SG) .............................. 10201605211S

(51) Int. Cl.
*H01L 23/367* (2006.01)
*H01L 23/31* (2006.01)
(Continued)

(52) U.S. Cl.
CPC ...... *H01L 23/3672* (2013.01); *H01L 23/3121* (2013.01); *H01L 23/42* (2013.01);
(Continued)

(58) Field of Classification Search
CPC . H01L 23/3672; H01L 23/3121; H01L 23/42; H01L 23/49816; H01L 23/49827;
(Continued)

(56) References Cited

U.S. PATENT DOCUMENTS

| 6,171,691 B1 | 1/2001 | Nishibayashi |
| 8,537,552 B2 | 9/2013 | Paquette et al. |

(Continued)

FOREIGN PATENT DOCUMENTS

| EP | 2824705 A2 | 1/2015 | |
| JP | H09-237867 A | 9/1997 | |
| TW | 201034133 A * | 9/2010 | ......... H01L 21/4853 |

OTHER PUBLICATIONS

Calculation Corner: Thermal Interactions Between High-Power Packages and Heat Sinks, Part 1. Dec. 6, 2010 [Retrieved on Jun. 23, 2017 from https://www.electronics-cooling.com/2010/12/calculation-corner-thermal-interactions-between-high-power-packages-and-heat-sinks-part-1/].

(Continued)

*Primary Examiner* — Henry Luong
(74) *Attorney, Agent, or Firm* — Womble Bond Dickinson (US) LLP

(57) ABSTRACT

Various embodiments may provide a semiconductor package. The semiconductor package may include a semiconductor chip, a first mold compound layer at least partially covering the semiconductor chip, and a redistribution layer over the first mold compound layer, the redistribution layer including one or more electrically conductive lines in electrical connection with the semiconductor chip. The semi- (Continued)

conductor package may additionally include a second mold compound layer over the redistribution layer, and an antenna array over the second mold compound layer, the antenna array configured to be coupled to the one or more electrically conductive lines.

15 Claims, 21 Drawing Sheets

(51) Int. Cl.
    *H01L 23/42*     (2006.01)
    *H01L 23/498*     (2006.01)
    *H01L 23/66*     (2006.01)
    *H01Q 1/22*     (2006.01)
    *H01L 23/64*     (2006.01)

(52) U.S. Cl.
    CPC .. *H01L 23/49816* (2013.01); *H01L 23/49822* (2013.01); *H01L 23/49827* (2013.01); *H01L 23/66* (2013.01); *H01Q 1/2283* (2013.01); *H01L 23/642* (2013.01); *H01L 23/645* (2013.01); *H01L 2223/6677* (2013.01)

(58) Field of Classification Search
    CPC ..... H01L 23/66; H01L 23/642; H01L 23/645; H01L 2223/6677; H01Q 1/2283
    See application file for complete search history.

(56) References Cited

U.S. PATENT DOCUMENTS

| | | | |
|---|---|---|---|
| 8,866,292 | B2 | 10/2014 | Beer et al. |
| 2011/0139878 | A1 | 6/2011 | Grasset |
| 2016/0020165 | A1* | 1/2016 | Kamgaing ............ H01L 21/486 257/532 |

OTHER PUBLICATIONS

International Search Report and the Written Opinion of the International Searching Authority for International Application No. PCT/SG2017/050291 dated Jul. 12, 2017.
International Preliminary Report on Patentability for International Application No. PCT/SG2017/050291 dated Aug. 17, 2018.
Edwards, D., "Enhance Thermal Performance Through Design and Optimization," Electronic Design, Jan. 7, 2013, 16 pages, Electronic Design, <http://www.electronicdesign.com/power/enhance-thermal-performance-through-design-and-optimization>.
Gu, et al., "W-Band Scalable Phased Arrays for Imaging and Communications," Integrated Circuits for Communications, Apr. 2015, 9 pages, vol. 53, No. 4, IEEE Communications Magazine.
Guenin, B., "Calculation Corner: Thermal Interactions Between High-Power Packages and Heat Sinks, Part 1," Electronics Cooling, Dec. 6, 2010, Lectrix, <https://www.electronics-cooling.com/2010/12/calculation-corner-thermal-interactions-between-high-power-packages-and-heat-sinks-part-1>.

* cited by examiner

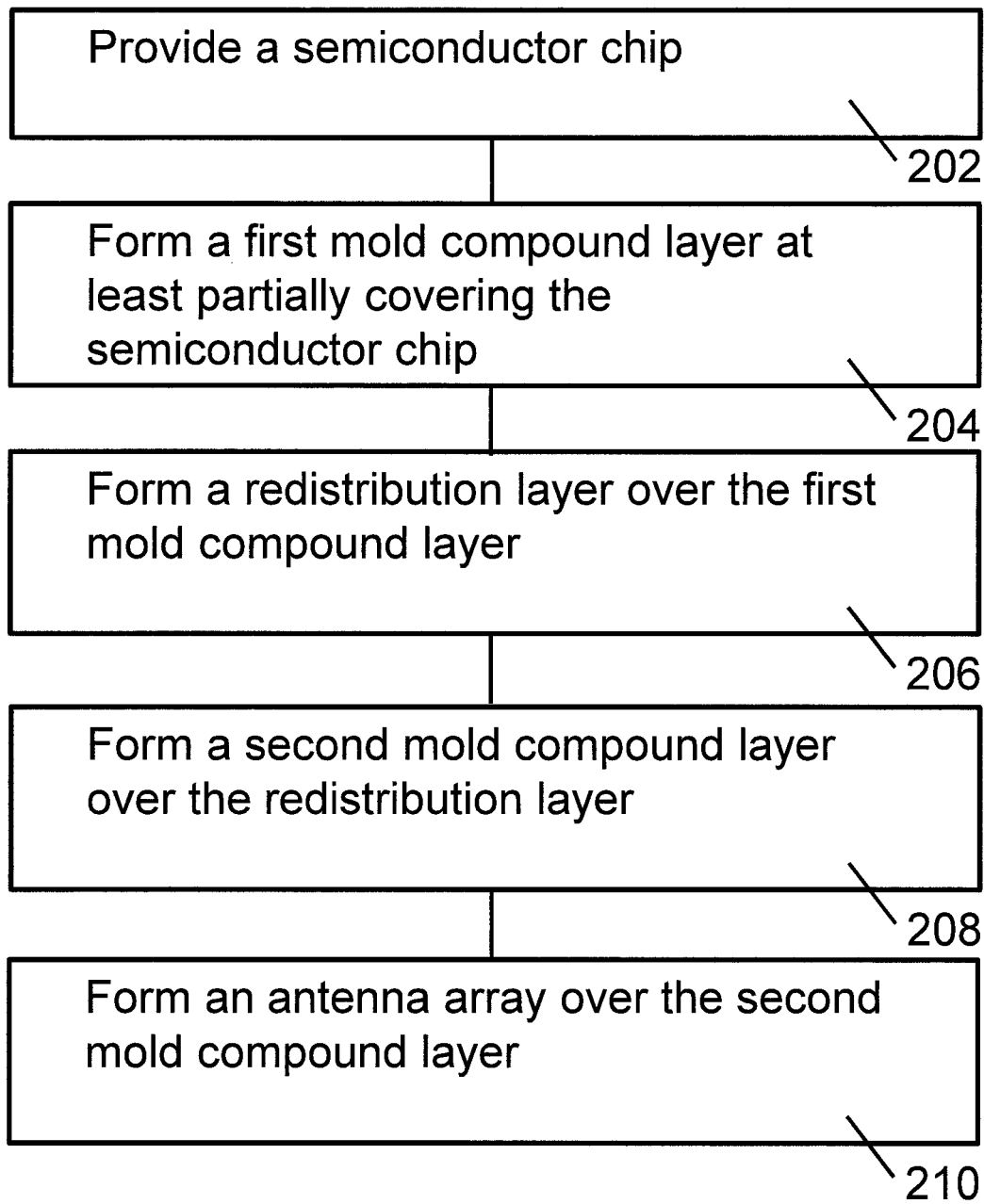

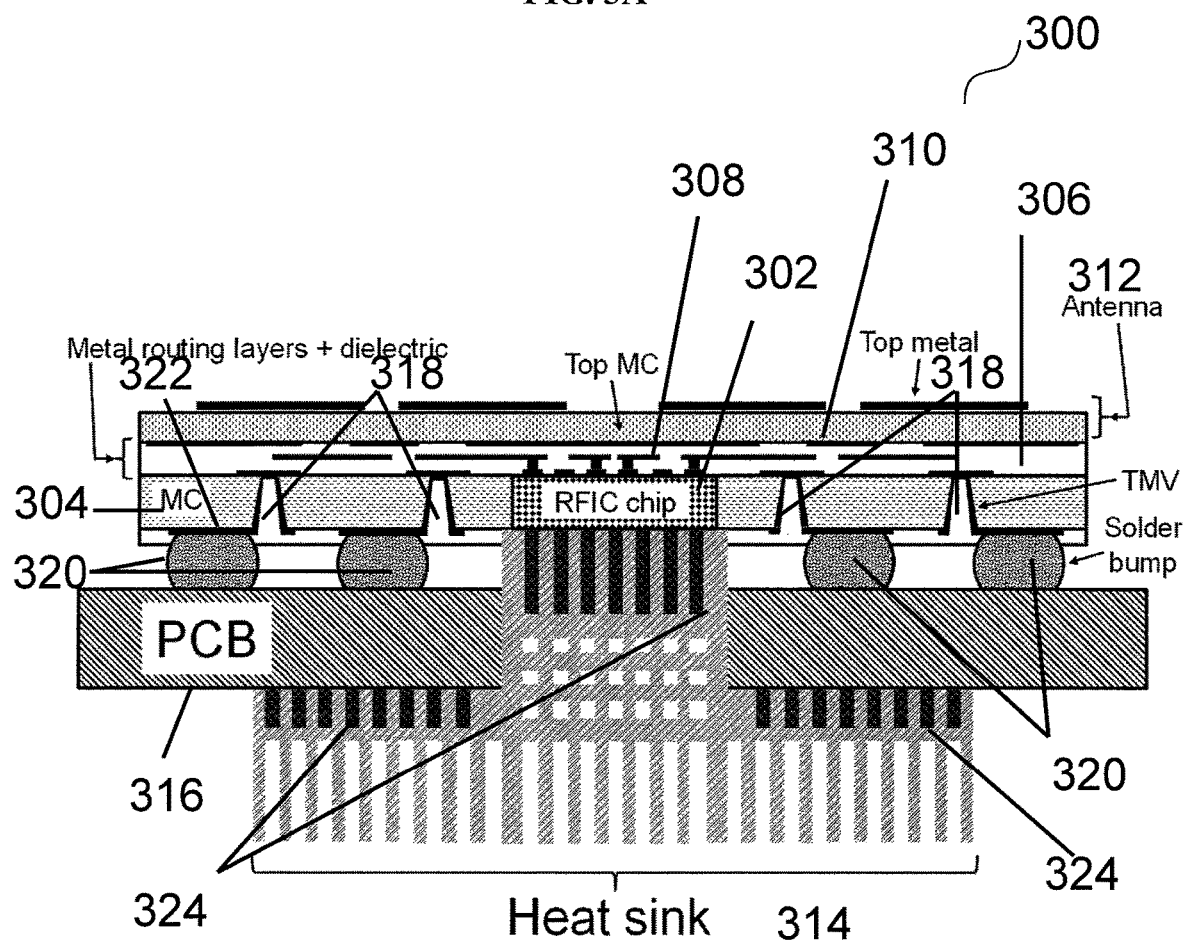

350

360

(a) Pick&place chips face down on mold plate (b) Wafer level molding (c) Remove carrier & RDL process on die side (d) 2nd wafer level molding on top side (e) Grind 2nd molding and process Top metal (f) Temp bond to carrier for backside process

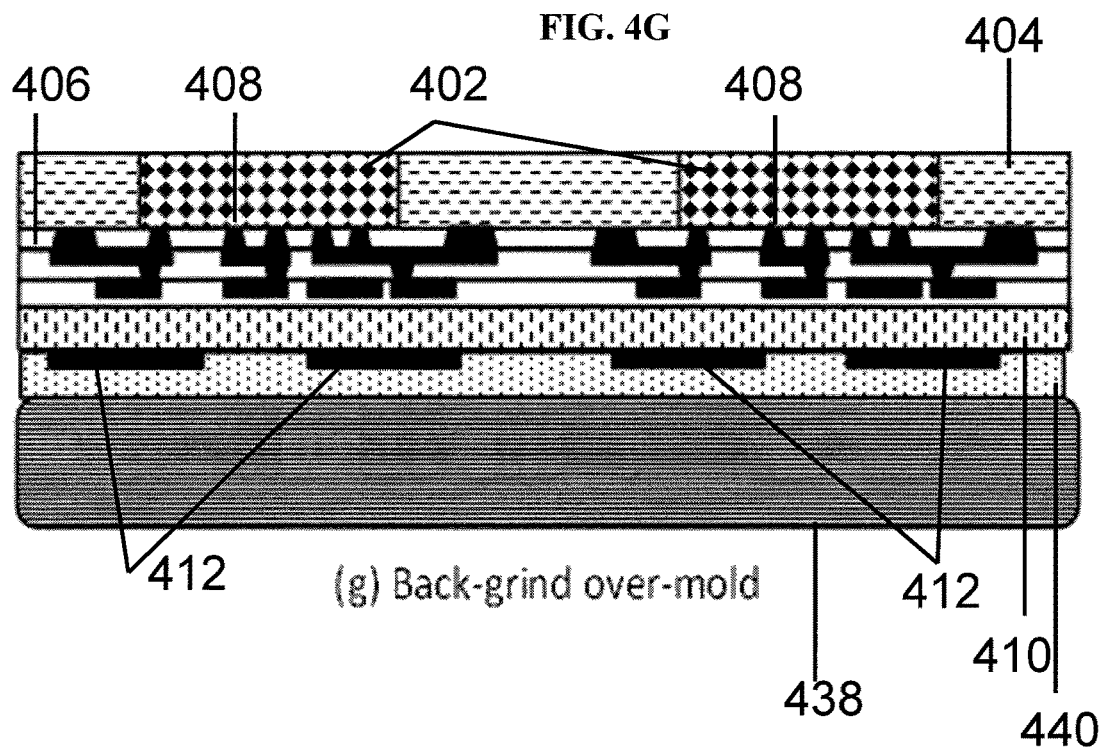
FIG. 4G (g) Back-grind over-mold
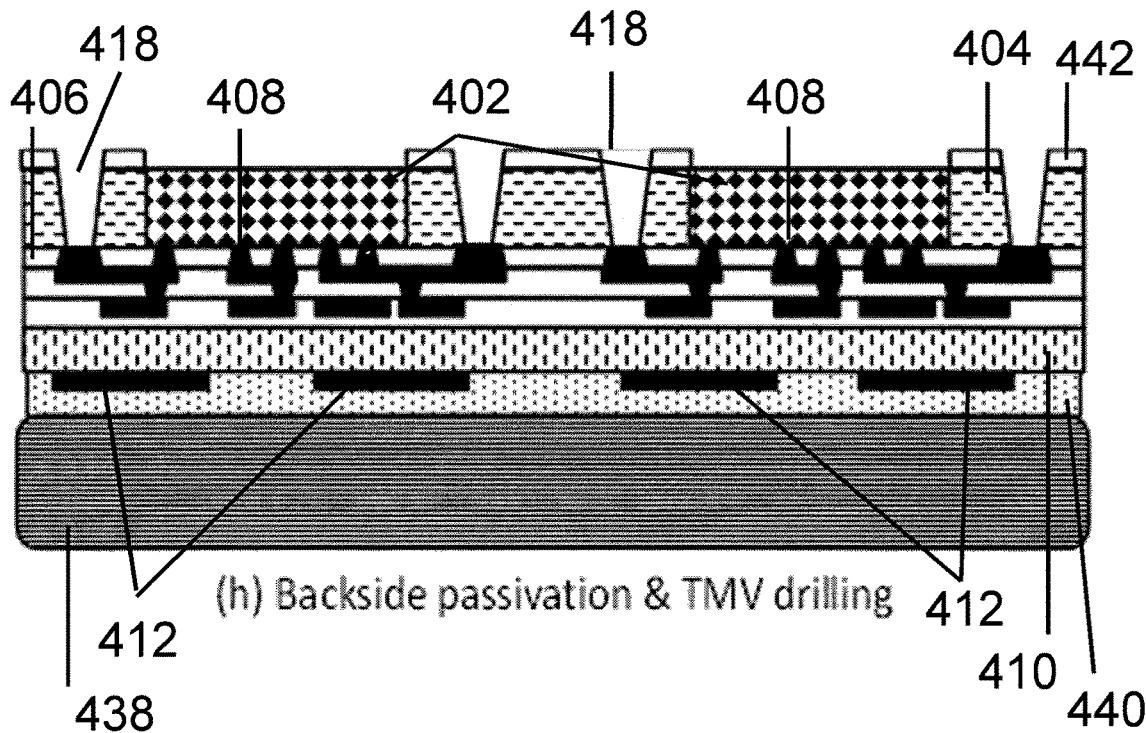
FIG. 4H (h) Backside passivation & TMV drilling

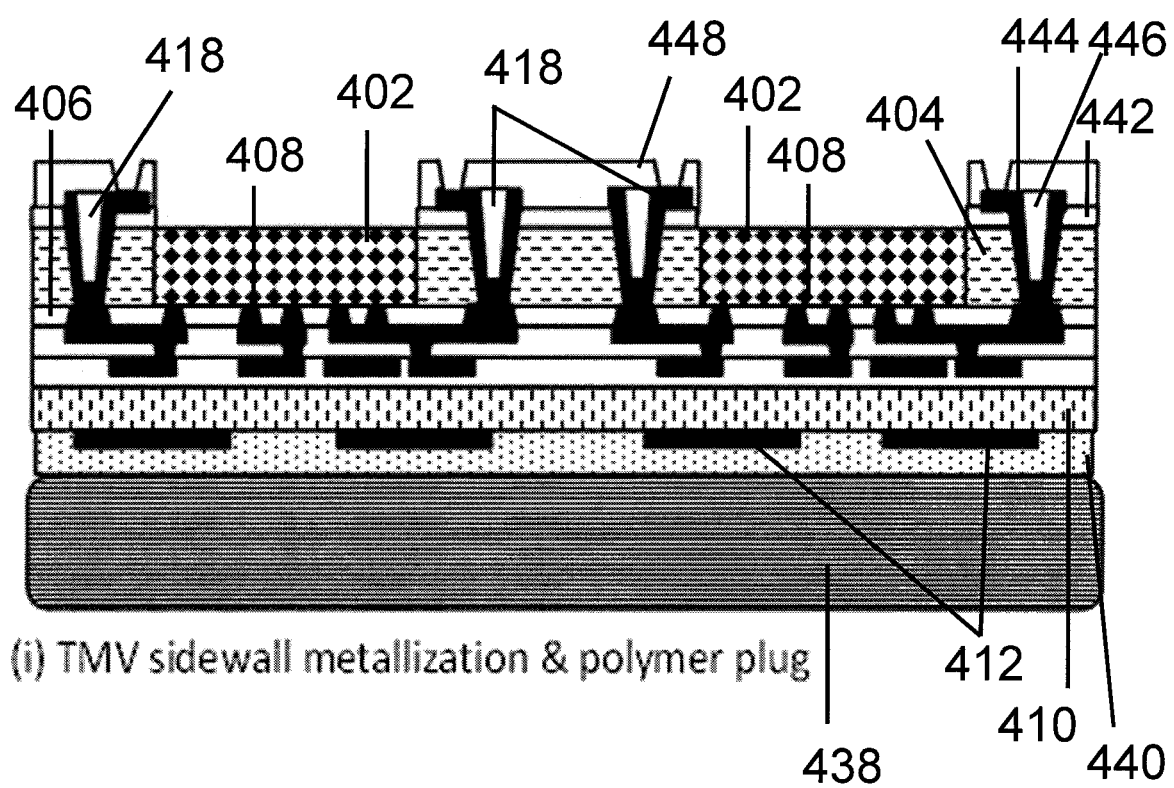

(j) Remove carrier & clean adhesive (k) Solder bumping on backside (l) Package singulation (m) Assembled to PCB and heat sink

SEMICONDUCTOR PACKAGE AND METHOD OF FORMING THE SAME

CROSS REFERENCE TO RELATED APPLICATIONS

This patent application is a U.S. National Phase Application under 35 U.S.C. § 371 of International Application No. PCT/SG2017/050921, filed on Jun. 8, 2017, entitled SEMICONDUCTOR PACKAGE AND METHOD OF FORMING THE SAME, which claims priority to Singapore application No. 10201605211S, filed on Jun. 24, 2016, the contents of which were hereby incorporated by reference in the entirety for all purposes.

TECHNICAL FIELD

Various aspects of this disclosure relate to semiconductor packages. Various aspects of this disclosure relate to methods of forming semiconductor packages.

BACKGROUND

Integration of antenna in a package is challenging because: 1) bulky antenna size; 2) tight antenna coupling; and 3) unpredictable antenna crosstalk. The antenna size is related to the operating frequency of the embedded chips in the package. For example, the dipole antenna length is approximately equal to half wavelength at the operating frequency. At 10 GHz, it is as long as 15 mm in free space. In this case, the main limitation factor on the package size would be the antenna as the embedded chips would usually occupy an area of few square millimeter only. The antenna size can be scaled down at increasing operating frequency. For instance, the free space wavelength at 60 GHz is reduced to 5 mm, which is more feasible to be integrated in the package. As such, the antenna in package is best targeted for millimeter wave wireless applications.

SUMMARY

Various embodiments may provide a semiconductor package. The semiconductor package may include a semiconductor chip. The semiconductor package may also include a first mold compound layer at least partially covering the semiconductor chip. The semiconductor package may further include a redistribution layer over the first mold compound layer, the redistribution layer including one or more electrically conductive lines in electrical connection with the semiconductor chip. The semiconductor package may additionally include a second mold compound layer over the redistribution layer. The semiconductor package may further include an antenna array over the second mold compound layer, the antenna array configured to be coupled to the one or more electrically conductive lines. The antenna array may be isolated from the one or more electrically conductive lines. The semiconductor chip may be configured to transmit one or more first electrical signals to the one or more conductive lines so that the antenna array emit one or more first wireless signals in response to the one or more first electrical signals. The semiconductor chip may be further configured to receive one or more second electrical signals from the one or more first conductive lines in response to the antenna array receiving one or more second wireless signals.

Various embodiments may provide a method of forming a semiconductor package. The method may include providing a semiconductor chip. The method may also include forming a first mold compound layer at least partially covering the semiconductor chip. The method may further include forming a redistribution layer over the first mold compound layer, the redistribution layer including one or more electrically conductive lines in electrical connection with the semiconductor chip. The method may also include forming a second mold compound layer over the redistribution layer. The method may additionally include forming an antenna array over the second mold compound layer, the antenna array configured to be coupled to the one or more electrically conductive lines. The antenna array may be isolated from the one or more electrically conductive lines. The semiconductor chip may be configured to transmit one or more first electrical signals to the one or more conductive lines so that the antenna array emit one or more first wireless signals in response to the one or more first electrical signals. The semiconductor chip may be further configured to receive one or more second electrical signals from the one or more first conductive lines in response to the antenna array receiving one or more second wireless signals.

BRIEF DESCRIPTION OF THE DRAWINGS

The invention will be better understood with reference to the detailed description when considered in conjunction with the non-limiting examples and the accompanying drawings, in which:

FIG. 2 shows a general schematic of a method of forming a semiconductor package according to various embodiments.

FIG. 3A shows a cross-sectional side view of a semiconductor package according to various embodiments.

FIG. 4G shows backgrinding of the first mold compound layer according to various embodiments.

FIG. 4H shows backside passivation and forming of through mold vias (TMVs) according to various embodiments.

FIG. 4I shows electroplating the walls of the through mold vias, filling remaining via space with polymer, and forming of a further dielectric passivation layer according to various embodiments.

DETAILED DESCRIPTION

Figure 1:
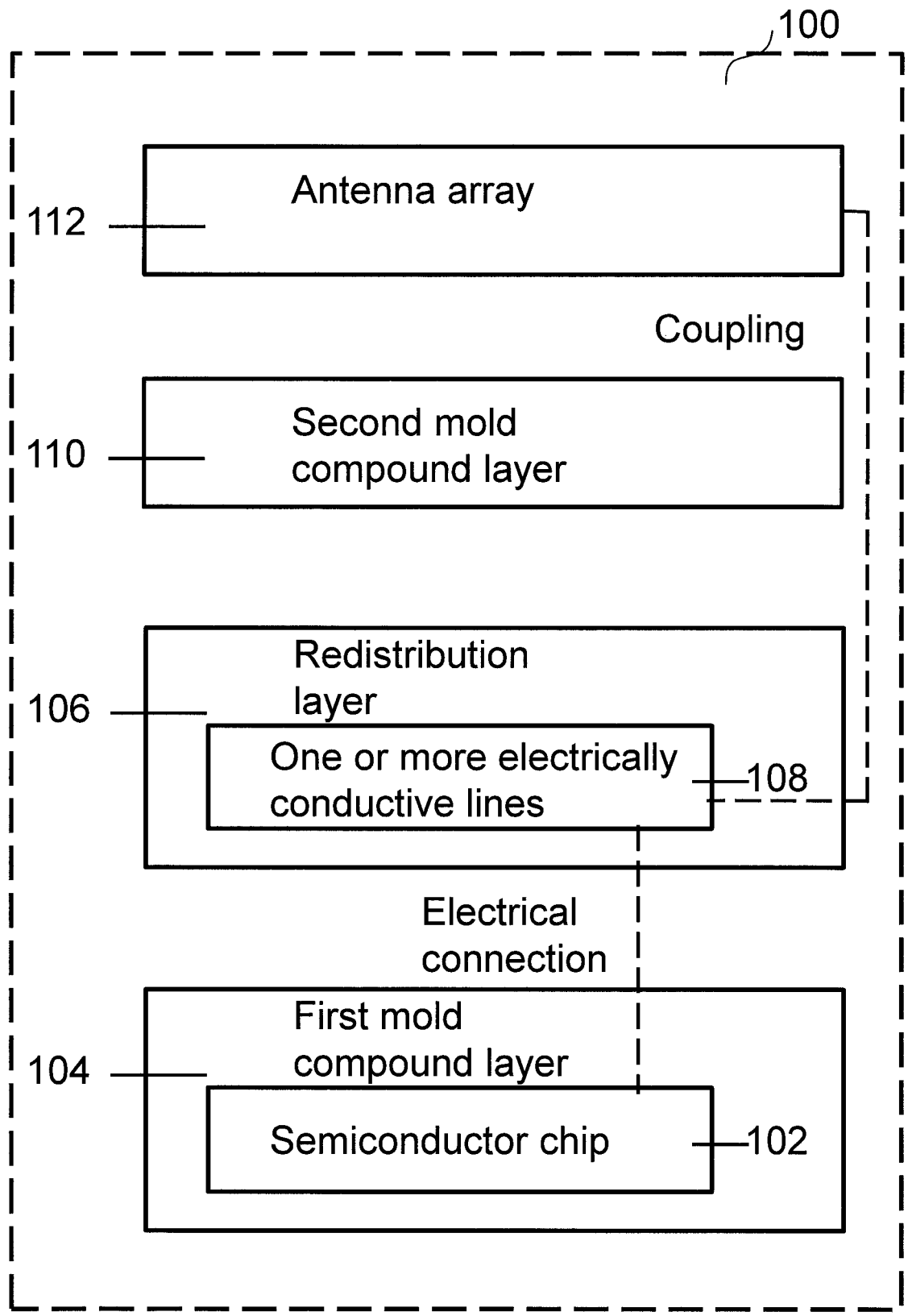
FIG. 1 shows a general schematic of a semiconductor package according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or one of the semiconductor package is analogously valid for the other methods or semiconductor packages. Similarly, embodiments described in the context of a method are analogously valid for a semiconductor package, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

An antenna contains a radiating element in order to transmit or receive signals in the atmosphere. As an example, a microstrip patch antenna may include a radiating patch on top of a metallic ground plate. The fringe field at the edge of the radiating patch may be radiating out at the operating frequency. However, not all may be radiated out to the atmosphere. Part of the fringe field may end up at the metallic ground plate underneath. The closer the ground plate to the radiating patch, the tighter the coupling may be between them. Most of the fringe field may not be radiated out and thus the antenna gain may be decreased.

In order to increase the antenna gain, the separation between different metal layers, e.g. the radiating patch and the ground plate, may be increased to reduce the coupling, but there are usually process constraints in the inter-dielectric thickness between metal layers.

Various embodiments may provide a semiconductor package or package structure with double mold compound layers for controlling antenna height to address the abovementioned issues.

As the electromagnetic field is radiating out from the antenna, any metallic objects nearby may affect the field distribution around the antenna and consequently degrade the antenna performance (e.g. decreased antenna gain and undesired side lobe generation). Such kind of crosstalk may exist between different antenna elements in an antenna array, between the signal routing layers and the antenna elements, and even between other metallic objects (such as, heat sink in the package for thermal cooling) and the antenna elements. The package layout floor planning for antenna in package may be important in order to avoid any crosstalk and electromagnetic interference problem. A semiconductor package or package structure with integrated antenna array and thermal cooling structure (i.e. heat sink) may be provided to address the abovementioned issues. These two components may be located at different side of the package. The antenna array performance may be maintained while the heat sink may be attached to the die back side for effective heat dissipation.

FIG. 1 shows a general schematic of a semiconductor package 100 according to various embodiments. The semiconductor package 100 may also alternatively be referred to as a package structure. The semiconductor package 100 may include a semiconductor chip 102. The semiconductor package 100 may also include a first mold compound layer 104 at least partially covering the semiconductor chip 102. The semiconductor package may further include a redistribution layer 106 over the first mold compound layer 104, the redistribution layer 106 including one or more electrically conductive lines 108 in electrical connection with the semiconductor chip 102. The semiconductor package 100 may additionally include a second mold compound layer 110 over the redistribution layer 106. The semiconductor package 100 may further include an antenna array 112 over the second mold compound layer 110, the antenna array 112 configured to be coupled to the one or more electrically conductive lines 108. The antenna array 112 may be isolated from the one or more electrically conductive lines 108. The semiconductor chip 104 may be configured to transmit one or more first electrical signals to the one or more conductive lines 108 so that the antenna array 112 emit one or more first wireless signals in response to the one or more first electrical signals. The semiconductor chip 104 may be further configured to receive one or more second electrical signals from the one or more first conductive lines 108 in response to the antenna array 112 receiving one or more second wireless signals.

In other words, the semiconductor package 100 may include a first mold compound layer 104 at least partially encapsulating the semiconductor chip 102. The semiconductor package 100 may also include a second mold compound layer 110, and a redistribution layer 106 between the first mold compound layer 104 and the second mold compound layer 110. The redistribution layer 106 may include one or more conductive lines 108 electrically connected to the chip 102. The semiconductor package 100 may further include an antenna array 112 with the second mold compound layer 110 isolating the antenna array 112 from the redistribution layer 106.

The provision of the first mold compound layer 104 and/or the second mold compound layer 110 may help to reduce the coupling between different metal layers, thereby allowing for a reduction in the package height. In various embodiments, the provision of the second mold compound layer 110 may help reduce coupling between the antenna array 112 and feeding lines and/or ground plates in the redistribution layer 106. The second mold compound layer 110 may be sufficiently thick and/or have a sufficiently high dielectric constant to reduce coupling between the antenna array 112 and feeding lines and/or ground plates. The provision of the first mold compound layer 104 and the second mold compound layer 110 may reduce the effect of the heat sink or thermal cooling structure on the antenna array 112.

In various embodiments, the antenna array 112 isolated from the one or more electrically conductive lines 108 may refer to the antenna array 112 physically isolated from the one or more electrically conductive lines 108. In other words, the antenna array 112 may not be in direct contact with the one or more electrically conductive lines 108. Additionally, the antenna array 112 isolated from the one or more electrically conductive lines 108 may refer to the antenna array 112 electrically isolated from the one or more electrically conductive lines 108. In other words, no substantial current may directly flow between the antenna array 112 and the one or more electrically conductive lines 108, i.e. from the antenna array 112 to the one or more electrically conductive lines 108, and/or from the one or more electrically conductive lines 108 to the antenna array 112.

In various embodiments, the antenna array 112 configured to be coupled to the one or more electrically conductive lines 108 may refer to the antenna array 112 configured to be inductively coupled and/or capacitively coupled to the one or more electrically conductive lines 108. The antenna array 112 may be configured to be at least one of inductively coupled and capacitively coupled to the one or more electrically conductive lines 108. In other words, the coupling between the one or more conductive lines 108 and the antenna array 112 may be inductive coupling and/or capacitive coupling.

In various embodiments, the semiconductor package 100 may further include a thermal cooling structure in thermal contact with the semiconductor chip 102.

In various embodiments, the semiconductor chip 102 may include one or more die electrical contacts on a first planar surface of the semiconductor chip. The one or more electrically conductive lines 108 may be in contact with the one or more die electrical contacts. Alternatively, the package 100 may include one or more interconnects connecting the one or more electrically conductive lines 108 and the one or more die electrical contacts.

The thermal cooling structure may be in contact with a second planar surface of the semiconductor chip 102 opposite the first planar surface.

The thermal cooling structure may include a plurality of contact fins in contact with the semiconductor chip. The thermal cooling structure may further include a plurality of convection fins in thermal contact with the plurality of the contact fins.

The thermal cooling structure may further include a lateral plate having a first surface in contact with the plurality of contact fins, and a second surface in contact with the plurality of convection fins.

The thermal cooling structure may further include one or more spreading pads in thermal contact with the plurality of the convection fins. The one or more spreading pads may extend substantially perpendicular to the plurality of convection fins.

The thermal cooling structure further may further include a thermal filler between the plurality of contact fins.

In various embodiments, the redistribution layer 102 may include one or more dielectric layers at least partially covering the one or more electrically conductive lines 108, e.g. metal lines.

The redistribution layer 106 may further include a plurality of further electrically conductive lines, e.g. metal lines. The one or more electrically conductive lines 108 may be feeding lines. The plurality of further electrically conductive lines may be ground plates, or may be electrically connected to ground plates. Each of the one or more ground plates may include an aperture. A feeding line may be vertically aligned to the aperture of each ground plate. The one or more ground plates may include a suitable metal. The one or more ground plates and/or the plurality of further electrically conductive lines may be electrically connected to ground.

The antenna array 112 may include a plurality of patch elements (alternatively referred to as patches or patch plates). The aperture may be over a corresponding electrically conductive line of the plurality of conductive lines 108 so that the aperture is between the corresponding electrically conductive line 108 and a corresponding patch element of the plurality of patch elements. In various embodiments, a distance between the corresponding electrically conductive line and a plane formed by the ground plate (the plane or ground plate including the aperture) may be less than 10 µm, e.g. less than 5 µm, e.g. 3 µm. In various embodiments, a distance between the corresponding patch element and the plane formed by the ground plate may be greater than a distance between the corresponding electrical line and the plane formed by the ground plate.

In various embodiments, the semiconductor package 100 may include a plurality of mold layer electrical contacts on a first surface of the first mold compound layer 104 opposite a second surface of the first mold compound layer 104 in contact with the redistribution layer 106. The package 100 or the first mold compound layer 104 may include one or more through mold vias extending from the first surface of the first mold compound layer 104 to the second surface of the first mold compound layer 104, the one or more through mold vias configured to electrically couple the plurality of further electrically conductive lines with the one or more mold layer electrical contacts. In various other embodiments, the plurality of further electrically conductive lines may be in electrical connection with the semiconductor chip 102. The one or more through mold vias may include a suitable electrically conductive material, e.g. a metal such as copper. The suitable metal may be electroplated onto sidewalls of the one or more through mold vias.

In various embodiments, the semiconductor package 100 may include a substrate. The semiconductor package 100 may also include one or more solder elements, each solder element connecting one of the one or more mold layer electrical contacts with the substrate.

In various embodiments, a thickness of the second mold compound layer may be more than 50 µm, e.g. more than 70 µm, e.g. 100 µm.

The first mold compound layer and/or the second mold compound layer may include a suitable mold compound, such as epoxy resin, polyester resin, vinyl ester, or silicone.

The semiconductor package 100 may be configured to operate from 30 to 300 GHz, e.g. 60 GHz. In various embodiments, the first wireless signals and/or the second wireless signals may have a frequency in the range from 30 to 300 GHz, e.g. 60 GHz. The first wireless signals and/or the second wireless signals may have a wavelength from 1 cm to 1 mm.

The antenna array 112 may include one or more antenna elements, which may be micro strip patches.

FIG. 2 shows a general schematic 200 of a method of forming a semiconductor package according to various embodiments. The method may include, in 202, providing a semiconductor chip. The method may also include, in 204, forming a first mold compound layer at least partially covering the semiconductor chip. The method may further include, in 206, forming a redistribution layer over the first mold compound layer, the redistribution layer including one or more electrically conductive lines in electrical connection with the semiconductor chip. The method may also include, in 208, forming a second mold compound layer over the redistribution layer. The method may additionally include, in 210, forming an antenna array over the second mold compound layer, the antenna array configured to be coupled to the one or more electrically conductive lines. The antenna array may be isolated from the one or more electrically conductive lines. The semiconductor chip may be configured to transmit one or more first electrical signals to the one or more conductive lines so that the antenna array emit one or more first wireless signals in response to the one or more first electrical signals. The semiconductor chip may be further configured to receive one or more second electrical signals from the one or more first conductive lines in response to the antenna array receiving one or more second wireless signals.

In other words, the method may include a plurality of steps to form a semiconductor package as described herein. The method may include encapsulating a semiconductor chip with a suitable mold compound so that a first mold compound layer at least partially covering the semiconductor chip. The method may further include forming a redistribution layer, and a second mold compound layer, such that the redistribution layer is between the first mold compound layer and the second mold compound layer. The method may further include forming an antenna array such that the second mold compound layer is between the antenna array and the redistribution layer.

For avoidance of doubt, the method steps shown in FIG. 2 may not necessarily be in sequence.

In various embodiments, the first mold compound layer may be formed by compression molding process. In various embodiments, the second mold compound layer may be formed by compression molding process.

In various embodiments, the method may further include attaching or contacting a thermal cooling structure, e.g. a heat sink, to the semiconductor chip. The thermal cooling structure and the antenna array may be on opposing sides of the semiconductor chip.

FIG. 3A shows a cross-sectional side view of a semiconductor package 300 according to various embodiments. A semiconductor chip 302, such as a radio frequency integrated circuit chip (RFIC) 302, including or consisting of radio frequency (RF) multi-channel transceivers, may be embedded in a mold compound. In other words, the chip 302 may at least be partially covered by the bottom mold compound (MC) layer 304, alternatively referring to as the first mold compound layer 304.

At the front side of the chip 302, there may be electrically conductive lines, e.g. metal lines 308 electrically connected to pads of the chip 302 for RF signals, control signals and power/ground routing, etc. On the other hand, the back side of the chip 302 may be exposed so that a thermal cooling structure, alternatively referred to as a heat sink, may be attached directly to the chip 302 for thermal cooling. Heat may be dissipated out from the chip 302 at the back side. There may be no need to reserve space for thermal cooling solution in the signal routing region at the front side. This may simplify the routing complexity at the front side and may alleviate the crosstalk between different channels.

The metal routing layers or redistribution layer 306 may be implemented between the two mold compound (MC) layers 304, 310. The redistribution layer 306 may be used to fan out all the connections from the die 302 to the antenna array 312 (at the top of the package 300) and to the printed circuit board (PCB) 316 (through the through mold vias (TMVs) 318). The RF signal routings between the die 302 and the antenna array elements of the antenna array 312 may be as short as possible, and the crosstalk between those routings may also be considered. The RF signal routings may occupy the two topmost metal routing layers of the retribution layer 306 and may be coupled inductivity or capacitively to the antenna array elements 312. Other metal routing layers 322 can be used for routing the control signals and supply buses, etc. They can then be connected to the PCB 316 through TMVs 318 and solder bumps 320 at the back side of the package 300.

Above the metal routing layers 306, there may be another mold compound (MC) layer 310 (referred to as top mold compound layer or second mold compound layer), which may serve as the dielectric layer of the package 300, between the antenna array 312 and feeding lines/grounds plates in the redistribution layer 306. The layer 310 may include low loss and low dielectric constant material to reduce signal loss and enhance radiation efficiency. The elements of the antenna array 312 may be built of top of this mold compound layer 310. To simplify the fabrication process, there may be no vertical vias embedded in this mold compound layer 310. The elements of the antenna array 312 may not be physically connected to the metal routing layers 312. The coupling between the elements of the antenna array 312 and the redistribution layers 312 may be made either inductivity or capacitively to obtain good impedance matching and bandwidth. The mold compound thickness may be controlled to optimize the antenna coupling. When designing for operating in millimeter wave frequencies, the thickness should be in the order of few tens to few hundreds microns in order to provide appropriate antenna coupling and gain.

Using the conventional process of building dielectric passivation in RDL layers may result in dielectric thickness of only a few microns, which may be far from the target thickness. As such, this dielectric layer 310 may be implemented by compression molding process. The thickness of the second mold compound layer 310 may be well controlled by grinding with good uniformity. Good uniformity may assure consistent performance between different elements of the antenna array 312, and may therefore suppress undesired side lobe generation.

Figure 3B:
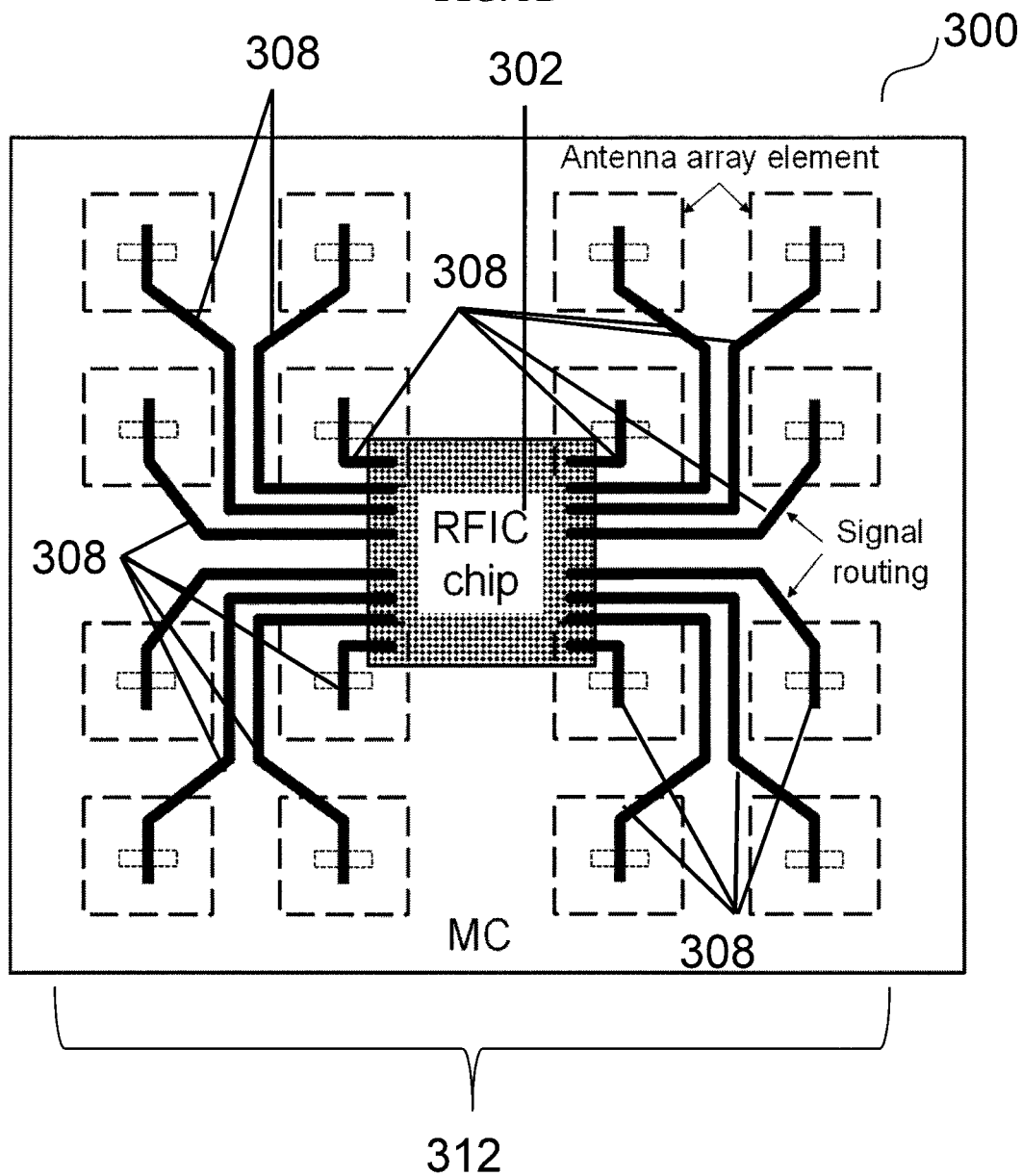
FIG. 3B shows a top planar view of the semiconductor package according to various embodiments.

FIG. 3B shows a top planar view of the semiconductor package 300 according to various embodiments. As shown in FIG. 3B, the semiconductor package 300 may have a 4×4 antenna array 312. 16 antenna array elements may be deployed on the top of the package front side. FIG. 3B illustrates an example of arranging the antenna array 312 elements in 4 groups of 2×2 arrays. The overall radiation direction may be perpendicular to the package front side, with the maximum gain at the package center. The corresponding RF signal routings may be distributed on the signal routing layers 308, extending from the RFIC chip 302 at the center of the package 300 to the corresponding antenna array 312 elements' aperture opening.

Figure 3C:
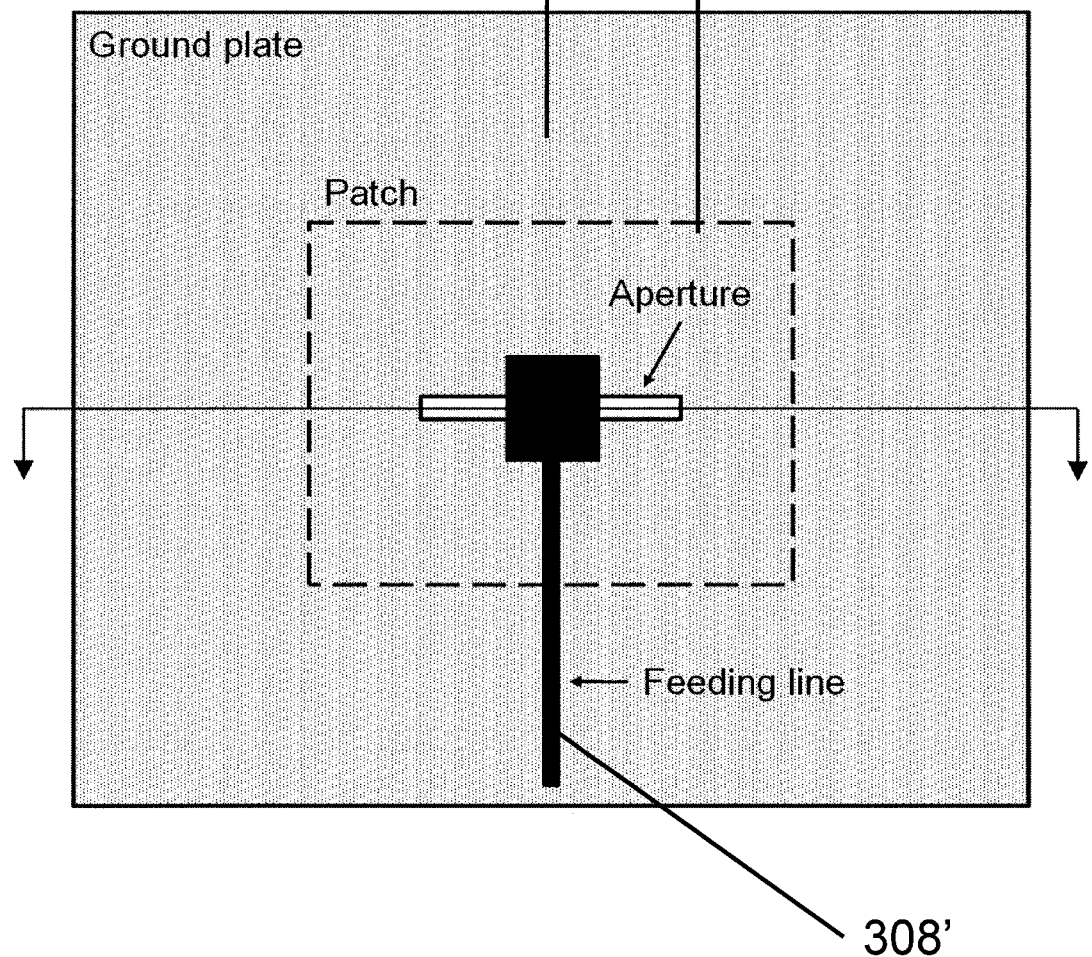
FIG. 3C shows a planar top view of a patch antenna according to various embodiments.
Figure 3D:
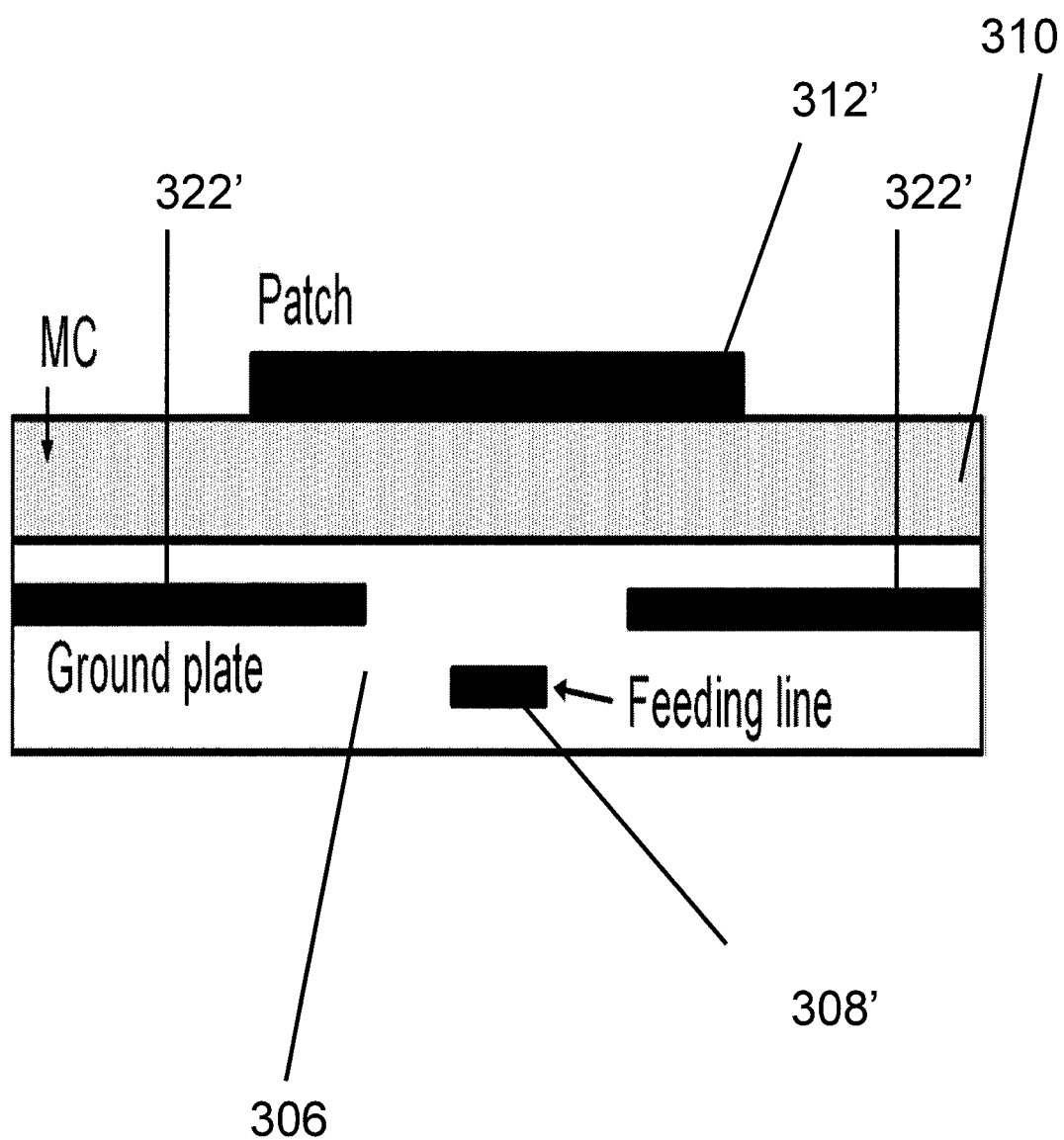
FIG. 3D shows a cross-sectional side view of the patch antenna according to various embodiments.

A microstrip patch antenna may be used to design the 4×4 antenna array 312 depicted in FIG. 3B. FIG. 3C shows a planar top view of a patch antenna according to various embodiments. FIG. 3D shows a cross-sectional side view of the patch antenna according to various embodiments. There may be an antenna array 312 element such as a rectangular patch 312' on the top of or over a ground plate 322'. Under the rectangular patch 312' area, there may an aperture opening at the ground plate 322' for coupling with the signal feeding lines 308' on the other side of the ground plate 322'. The size of the patch antenna may be about 1×1.2 mm² when operating at the 60 GHz band. The thickness of the top mold compound layer 310 under the patch 312' may be 100 um, while the inter-dielectric thickness between ground plate 322' and the feeding line 308' may be just 3 um. There may be different considerations in designing the antenna and feeding line.

Figure 3E:
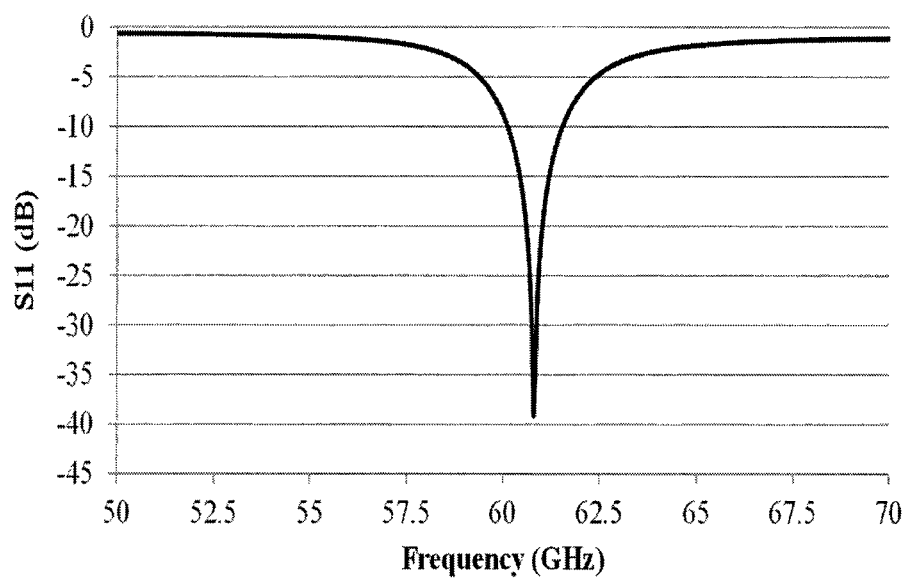
FIG. 3E shows a plot of signal S11 (in decibels or dB) as a function of frequency (in gigahertz or GHz) showing the return loss of the antenna array element according to various embodiments.

The feeding line 308' may have tighter coupling with the ground plate 322' for signal transmission. Moreover, the patch 312' may be further away from the ground plate 308' to enhance radiation. Due to the huge difference in thickness, it may not be recommended to build a dielectric layer between the patch 312' and ground plate 322' using the conventional process for making RDL dielectric passivation (which may be used to form the layer between the feeding line and ground plate). Instead, a mold compound layer 310 between the patch 312' and ground plate 322' may be formed using compression molding process. The thickness may be built to the order of hundred microns and precisely controlled. FIG. 3E shows a plot 350 of signal S11 (in decibels or dB) as a function of frequency (in gigahertz or GHz) showing the return loss of the antenna array element according to various embodiments. FIG. 3E demonstrates good impedance matching at 61 GHz with simulated return loss greater than 30 dB.

Figure 3F:
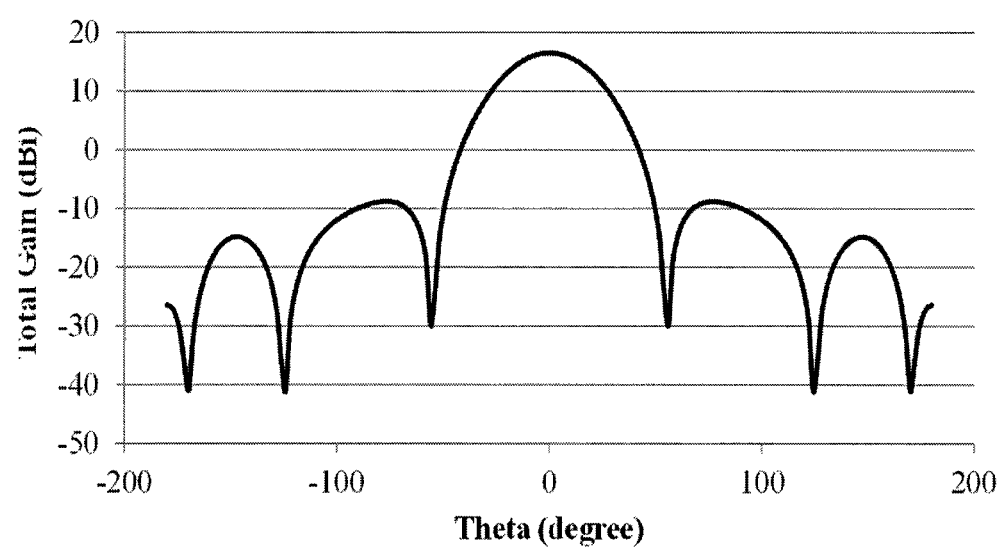
FIG. 3F shows a plot of gain (in decibels or dB as a function) of angle theta (in degrees) showing the radiation pattern of the 4×4 antenna array according to various embodiments.

FIG. 3F shows a plot 360 of gain (in decibels or dB as a function) of angle theta (in degrees) showing the radiation pattern of the 4×4 antenna array according to various embodiments. The simulated gain of the 4×4 antenna array is 16.5 dB with side lobe suppression of over 25 dB. The main lobe beam width is around 100°. The maximum radiation direction of the antenna array points to the z-direction (0°) at the front side of the package center when the package is placed in the x-y plane. Some side lobes are observed at the x-y plane (90°) due to leakage fields. Since the minimum side lobe suppression is more than 25 dB, the crosstalk with other components in the package may be negligible. At the back side of the package (180°), the suppression is even higher (more than 40 dB), which highlights the advantages of the package design according to various embodiments in reducing any interference between the antenna array 312 and other components in the package 300. Even though there may be a metallic heat sink 314 at the back side of the package 300, the sink 314 may have little or no influence on the antenna performance due to high side lobe suppression ratio.

Figure 3G:
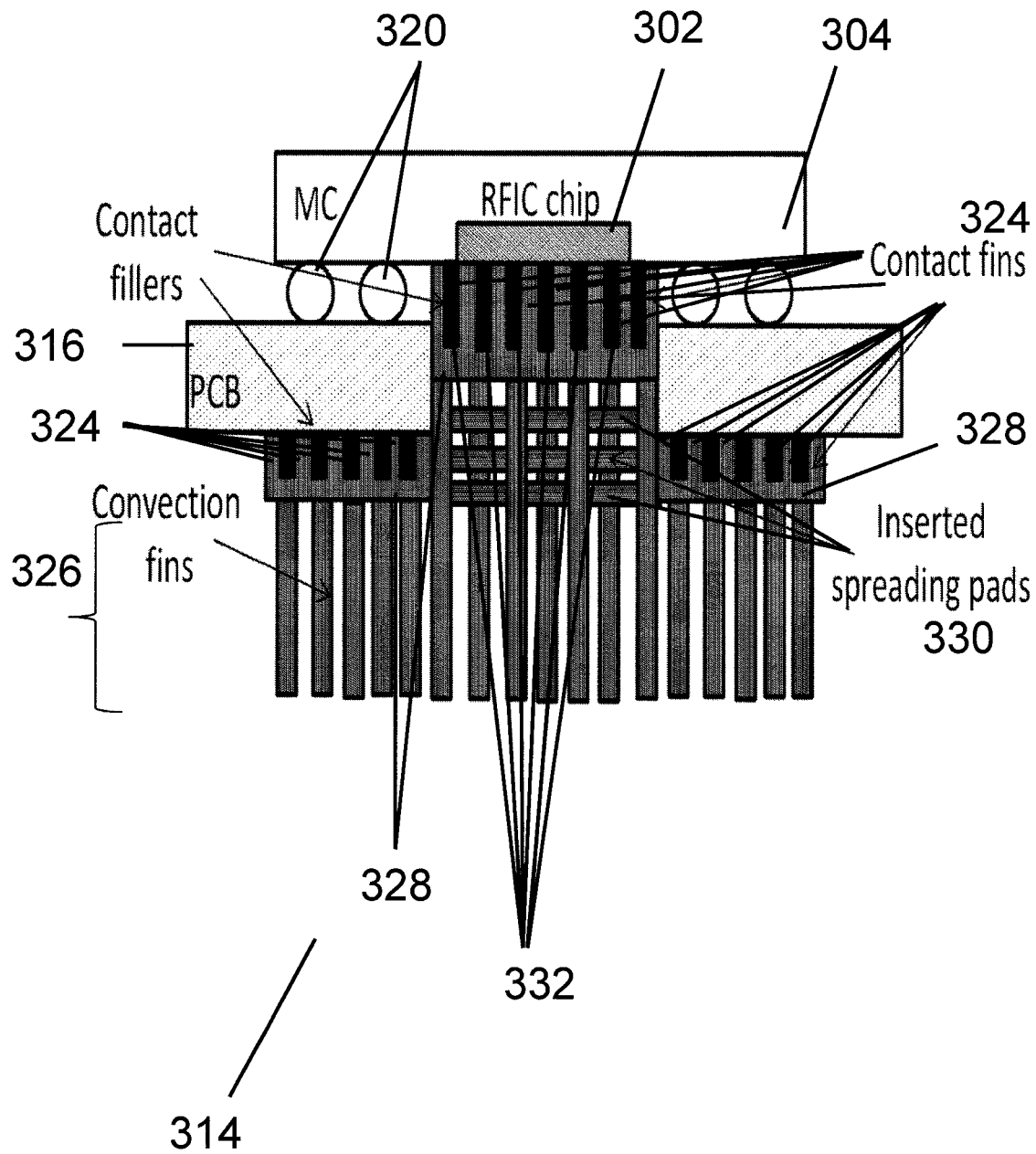
FIG. 3G shows a cross-sectional side view of a heat sink according to various embodiments.
Figure 3H:
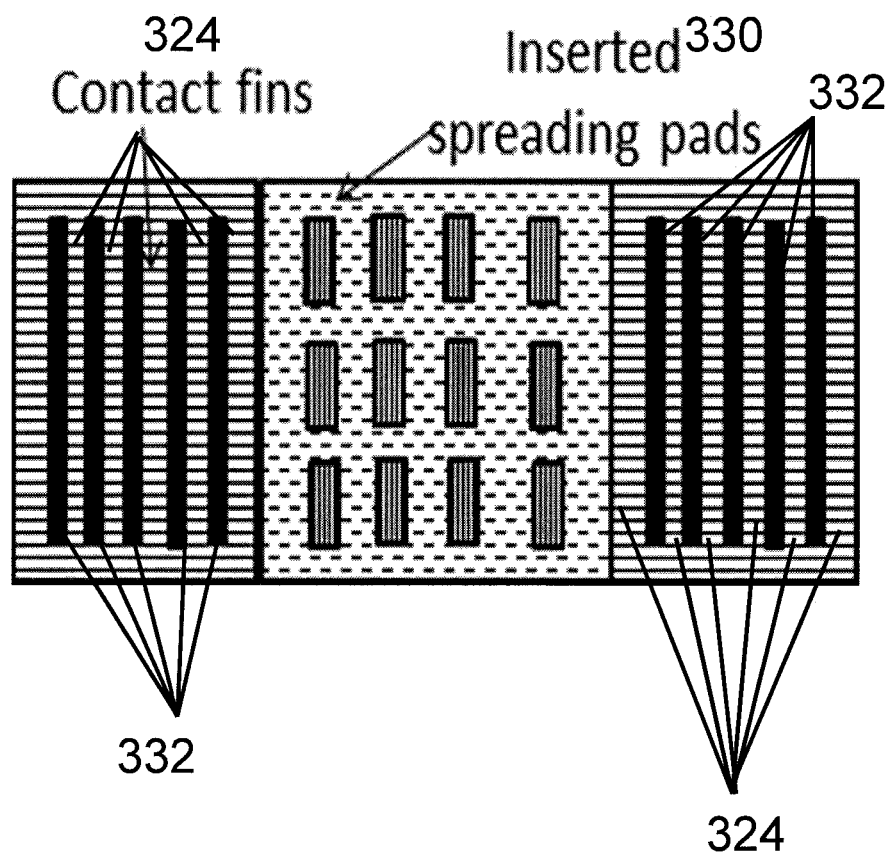
FIG. 3H shows a top planar view of the heat sink according to various embodiments.
Figure 3I:
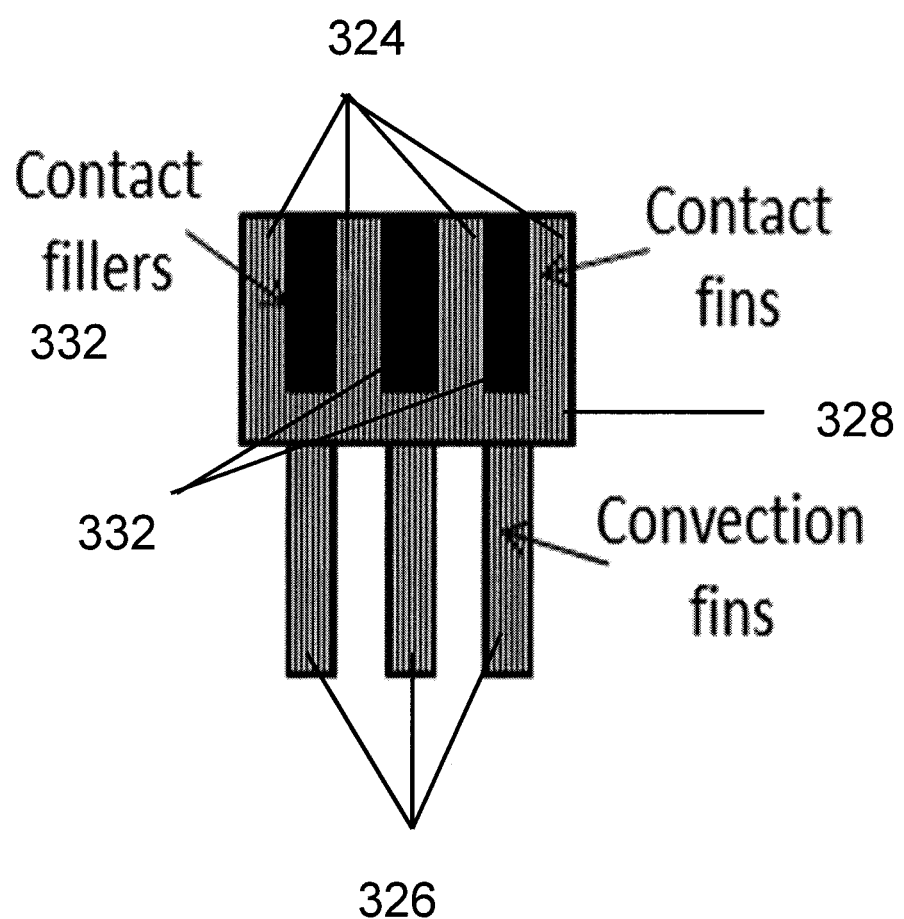
FIG. 3I shows a magnified cross-sectional side view of a portion of the heat sink according to various embodiments.

FIG. 3G shows a cross-sectional side view of a heat sink 314 according to various embodiments. FIG. 3H shows a top planar view of the heat sink 314 according to various embodiments. FIG. 3I shows a magnified cross-sectional side view of a portion of the heat sink 314 according to various embodiments. The heat sink 314 may alternatively be referred to as a thermal cooling structure. The heat sink 314 may include a plurality of contact fins 324 in contact with the semiconductor chip 302. The heat sink 314 may further include a plurality of further contact fins 324 in contact with the PCB 316. The heat sink 314 may further include a plurality of convection fins 326 forming a convection fin arrangement, the convection fin arrangement in thermal contact with the plurality of the contact fins and further contact fins 324. The heat sink 314 may include one or more lateral plates 328. Each lateral plate 328 may have a first surface in contact with the plurality of contact fins or further contact fins 324, and a second surface (opposite the first surface) in contact with the plurality of convection fins 226. The heat sink 314 may additionally include one or more spreading pads or inserted spreading fins 330 in thermal contact with at least some of the plurality of the convection fins 326. The one or more spreading pads 330 may extend substantially perpendicular to the plurality of convection fins 326. The heat sink 314 may further include a thermal filler 332 between the plurality of contact fins and/or further contact fins 324.

The heat generated in the chip 302 may be directly dissipated through the designed heat sink 314 to the bottom environment. During operation, large thermal stress may be induced due to high coefficient of thermal expansion (CTE) mismatch, which poses high failure risk to the thin chip 302 and the connection solder balls 320, especially the solder balls 320 located near the heat sink 314. The heat sink 314 may highly reduce the thermal stress, while maintaining effective cooling capability.

The thermal filler 332 may include materials of high thermal conductivity and low coefficient of thermal expansion (CTE), such as diamond and/or graphite, to fill the gap between multiple contact fins 324. A chamber filled with the materials may also be applied in the heat sink 314. A thin heat sink base plate 328 may be used to induce less thermal stress during chip operation. Multiple spreading pads 330 may be inserted to contact with convection fins 326 for convection area enlargement. In-plane thermal paths from the center to the surrounding areas may also be formed by using the spreading pads 330.

The filler/fin structures may be also used at the contact interfaces between heat sink and PCB to achieve high heat removal and low thermal stress. Multiple convection fins 326 may be arranged as is illustrated in FIG. 3I. At the same heat sink base location, one side may be a convection fin 326 while the other side may be contact filler 332. Since the filler materials 332 are of higher thermal conductivity than the heat sink material, this arrangement may enhance the heat conduction for the convection fin 326 to reject the heat to outside. In addition, the effect of the thermal stress induced in the convection fin 326 on the package can be further reduced. Different shapes and patterns of contact fins and convections may be used in the heat sink 314. A chamber filled with filler material may also be employed to decrease thermal stress and improve heat conduction.

For clarity purposes, not all similar elements shown in FIGS. 3A-I have been labelled.

Several simulations have been conducted to investigate the performances of using the heat sink 314. The induced thermal stress may be highly reduced by more than 50% both for the chip 302 and the solder balls 320. Improved heat dissipation capability can be achieved, and the dissipated heating power can be increased more than 25%, compared with the conventional heat sink.

Figure 4A:
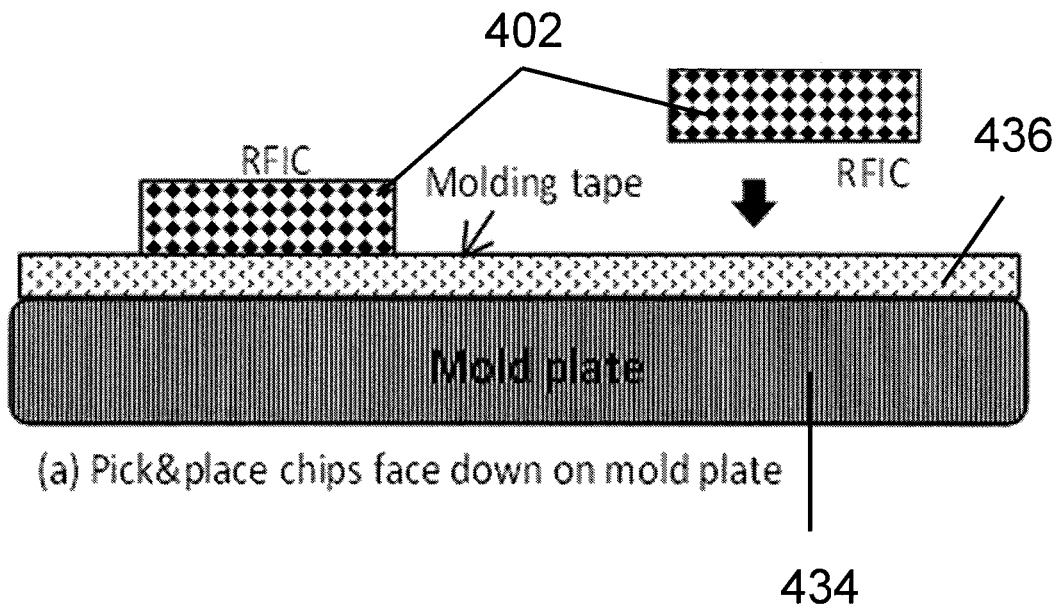
FIG. 4A shows attaching semiconductor chips to a mold plate using a molding tape according to various embodiments.

FIGS. 4A-M show a method of forming a semiconductor package according to various embodiments. The semiconductor package may be a wafer-scale package structure with integrated antenna and heat sink. FIG. 4A shows attaching semiconductor chips 402 to a mold plate 434 using a molding tape 436 according to various embodiments. The semiconductor chips 402, e.g. RFIC chips, may be first allocated on a mold plate 434 with a thermal release molding tape 436 by a standard pick and place process, as depicted in FIG. 4A. The chips 402 may be facing down with their active device surface attached to the molding tape 436.

Figure 4B:
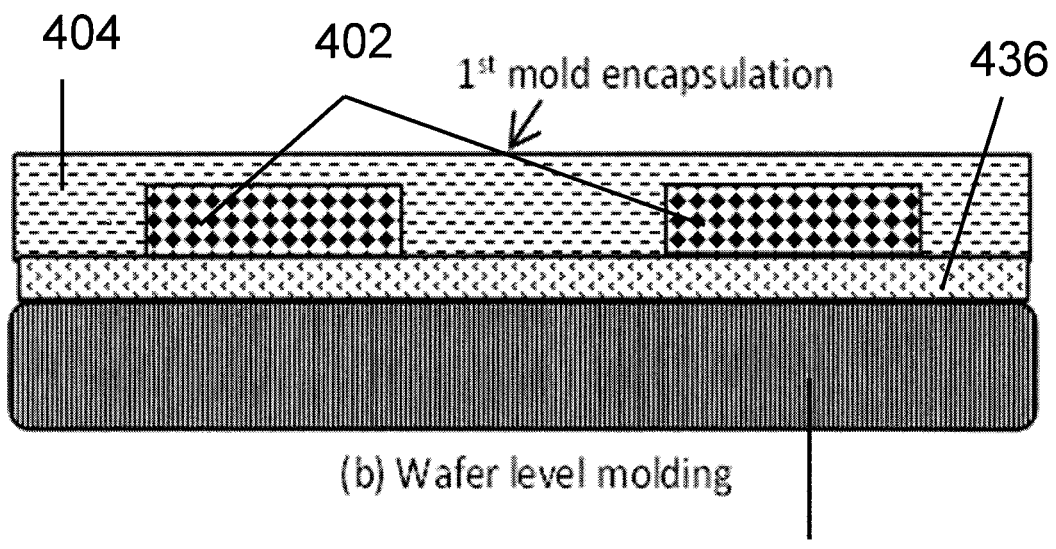
FIG. 4B shows forming of a first mold compound layer according to various embodiments.

FIG. 4B shows forming of a first mold compound layer 404 according to various embodiments. The chips 402 may be completely encapsulated by a molding compound with the compression molding process to form the first mold compound layer 404.

Figure 4C:
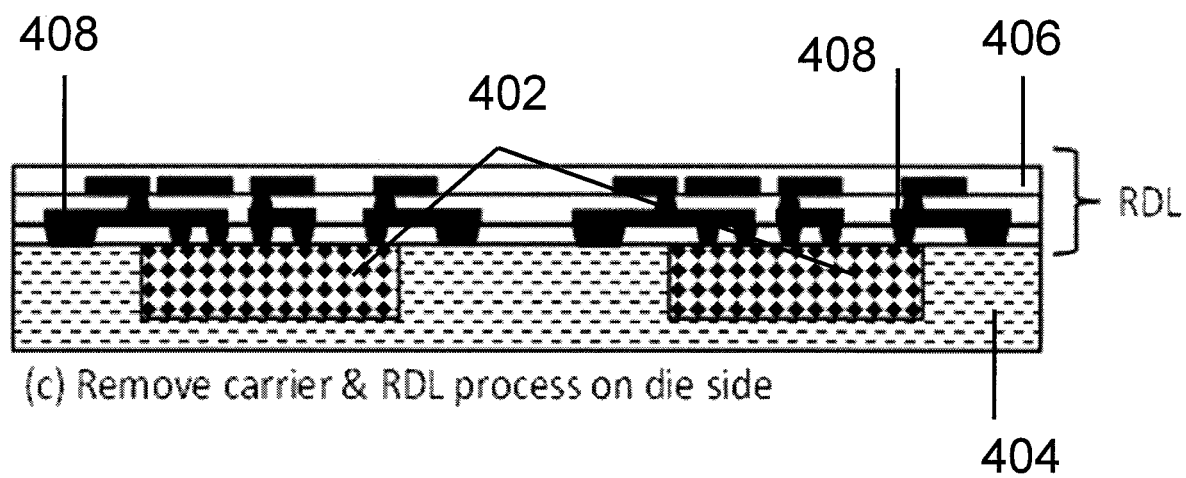
FIG. 4C shows detaching a reconfigured wafer including the chips and the first mold compound layer from the mold plate and forming of a redistribution layer according to various embodiments.

FIG. 4C shows detaching a reconfigured wafer including the chips 402 and the first mold compound layer 404 from the mold plate 434 and forming of a redistribution layer 406 according to various embodiments. The reconfigured wafer may be detached from the carrier 434 and a redistribution layer (RDL) 406 including multiple routing layers may be built on the front side of the chips 402. The RDL 406 may include one or more electrically conductive lines 408 electrically connected to the chips 402. The one or more electrically conductive lines may be used as signal routing layers.

Figure 4D:
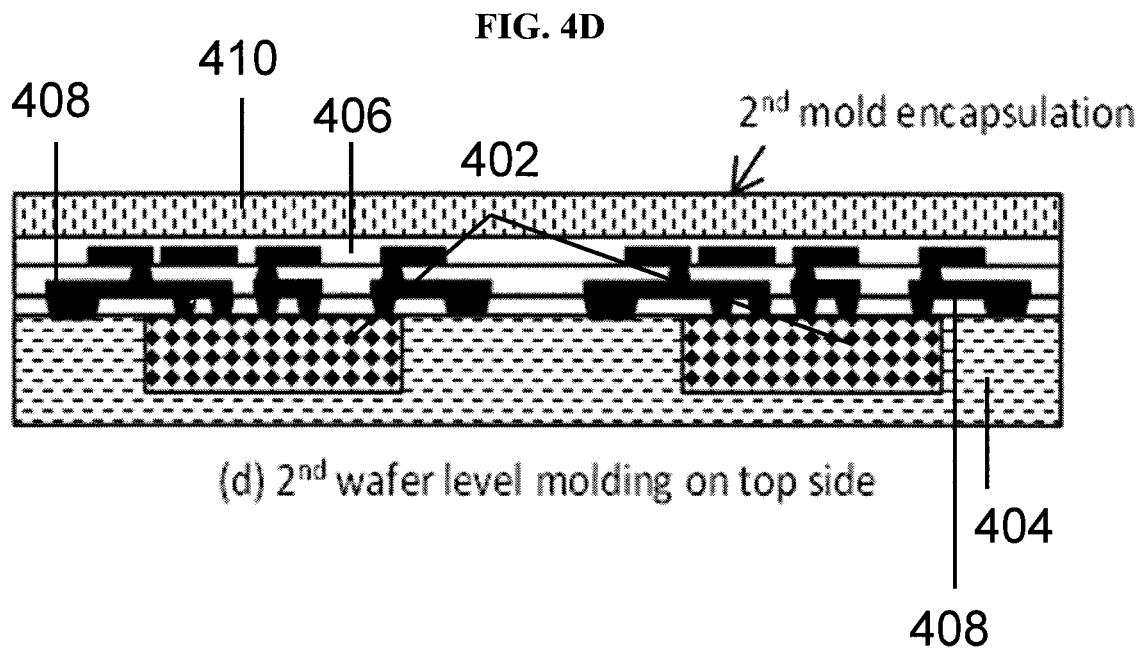
FIG. 4D shows forming a second mold compound layer according to various embodiments.

FIG. 4D shows forming a second mold compound layer 410 according to various embodiments. The second layer 410 of molding compound may be built on top of the RDL 406. The thickness of the second mold compound layer 410 may be critical in optimizing the antenna performance.

Figure 4E:
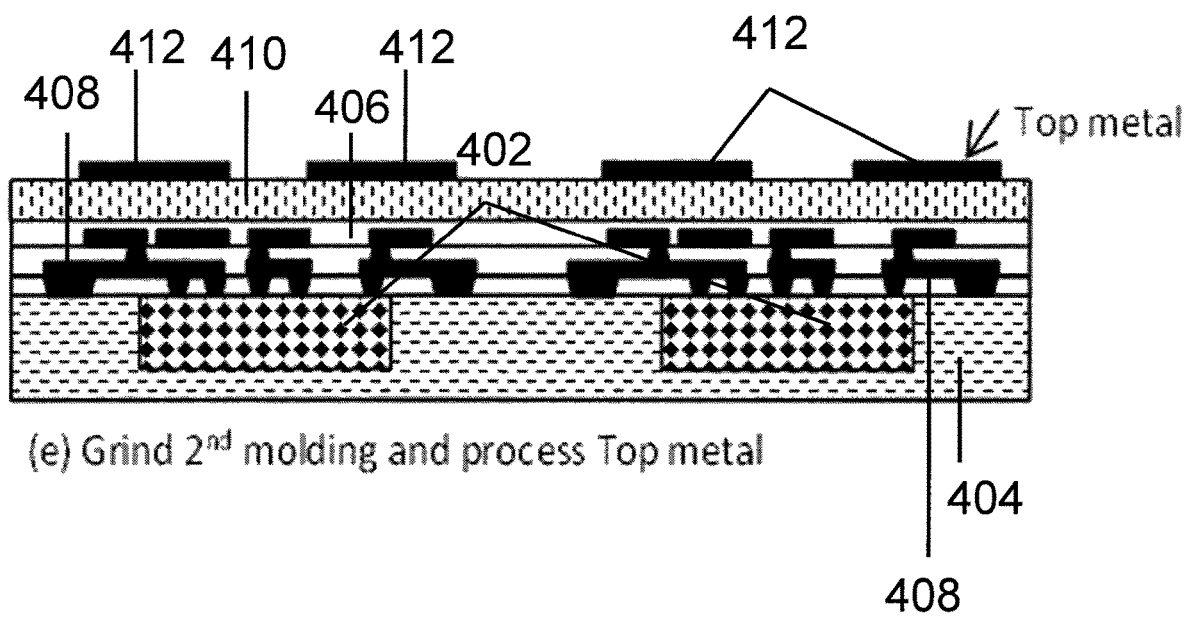
FIG. 4E shows grinding of the second mold compound layer and forming of antenna array according to various embodiments.

FIG. 4E shows grinding of the second mold compound layer 410 and forming of antenna array 412 according to various embodiments. The surface of the second molding compound layer 410 may be grinded to the desired thickness and a new metal layer to implement the antenna elements may be deposited on top of the second molding compound layer 410. The antenna elements may form the antenna array 412.

Figure 4F:
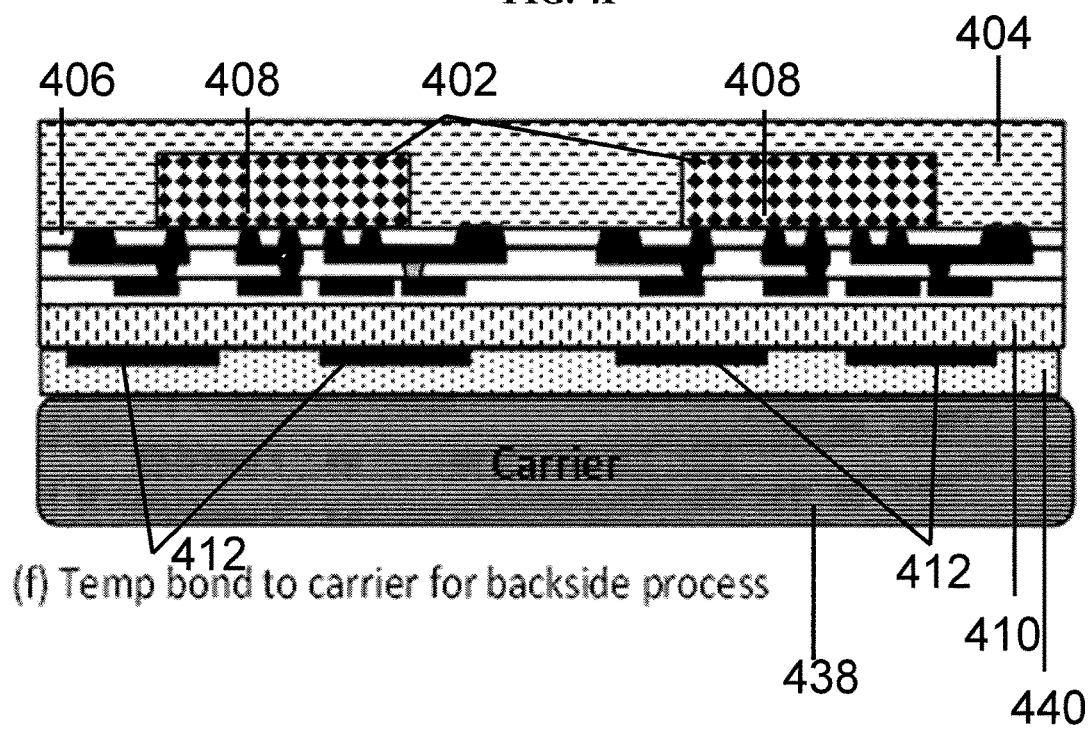
FIG. 4F shows bonding of a wafer including the chips, the first mold compound layer, the redistribution layer including one or more electrically conductive lines, the second mold compound layer and the antenna array to a temporary carrier via an adhesive layer according to various embodiments

FIG. 4F shows bonding of a wafer including the chips 402, the first mold compound layer 404, the redistribution layer 406 including one or more electrically conductive lines 408, the second mold compound layer 410 and the antenna array 412 to a temporary carrier 438 via an adhesive layer 440 according to various embodiments. The front side of the wafer with the top metal (antenna array 412) may be temporary bonded to the carrier 438 for backside process. FIG. 4G shows backgrinding of the first mold compound layer 404 according to various embodiments. The chips 402 may be exposed by backgrinding all the over-mold portion of the first mold compound layer 404 at the back side of the wafer.

FIG. 4H shows backside passivation and forming of through mold vias (TMVs) 418 according to various embodiments. The wafer back side may be passivated for electrical insulation by forming a dielectric passivation layer 442. Laser drilling process may be carried out to drill the TMVs 418 in the mold compound layer 404 for electrical connections between the RDL 406 and backside bumps.

FIG. 4I shows electroplating the walls of the through mold vias 418, filling remaining via space with polymer, and forming of a further dielectric passivation layer 448 according to various embodiments. The TMV sidewall may be electroplated with a suitable metal 444 e.g. copper, and the remaining via space is filled with polymer to form a polymer plug 446. Each TMV 418 may include an electroplated metal layer 444 and polymer plug 446. The polymer plug 446 may be surrounded by the electroplated metal layer 444. The further dielectric passivation layer 448 may be formed with the openings for backside bumps.

Figure 4J:
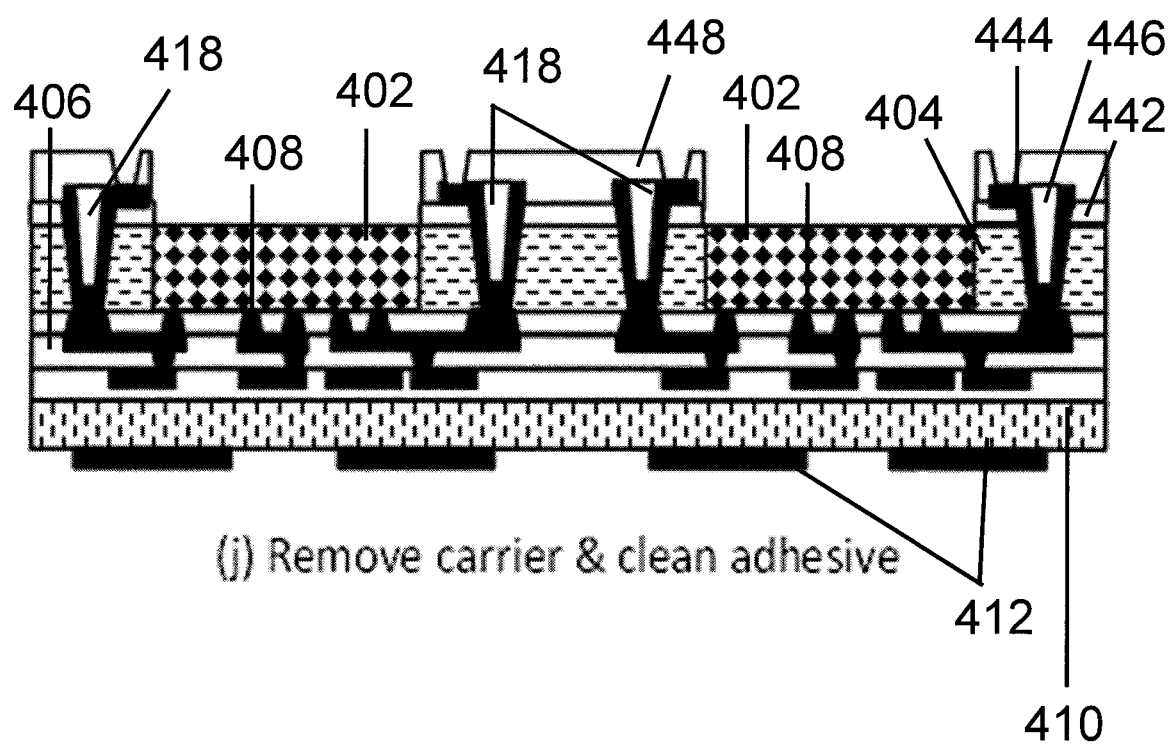
FIG. 4J shows removal of temporary carrier and adhesive layer according to various embodiments.
Figure 4K:
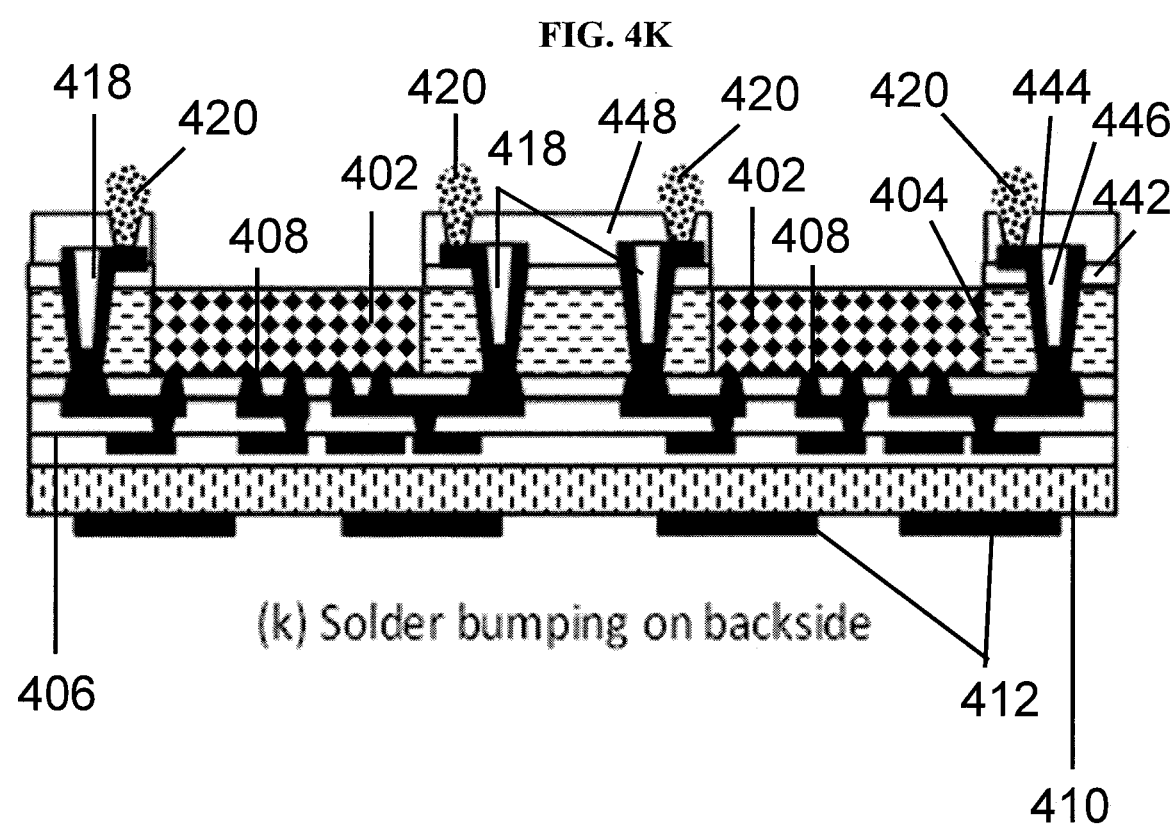
FIG. 4K shows forming of solder bumps according to various embodiments.

FIG. 4J shows removal of temporary carrier 438 and adhesive layer 440 according to various embodiments. The carrier 438 may be removed, and the wafer front side with top metal 412 may be cleaned to remove the adhesive layer 440. FIG. 4K shows forming of solder bumps 420 according to various embodiments. The solder bumpers 420 may be formed or injected on the specified bump locations at the wafer back side.

Figure 4L:
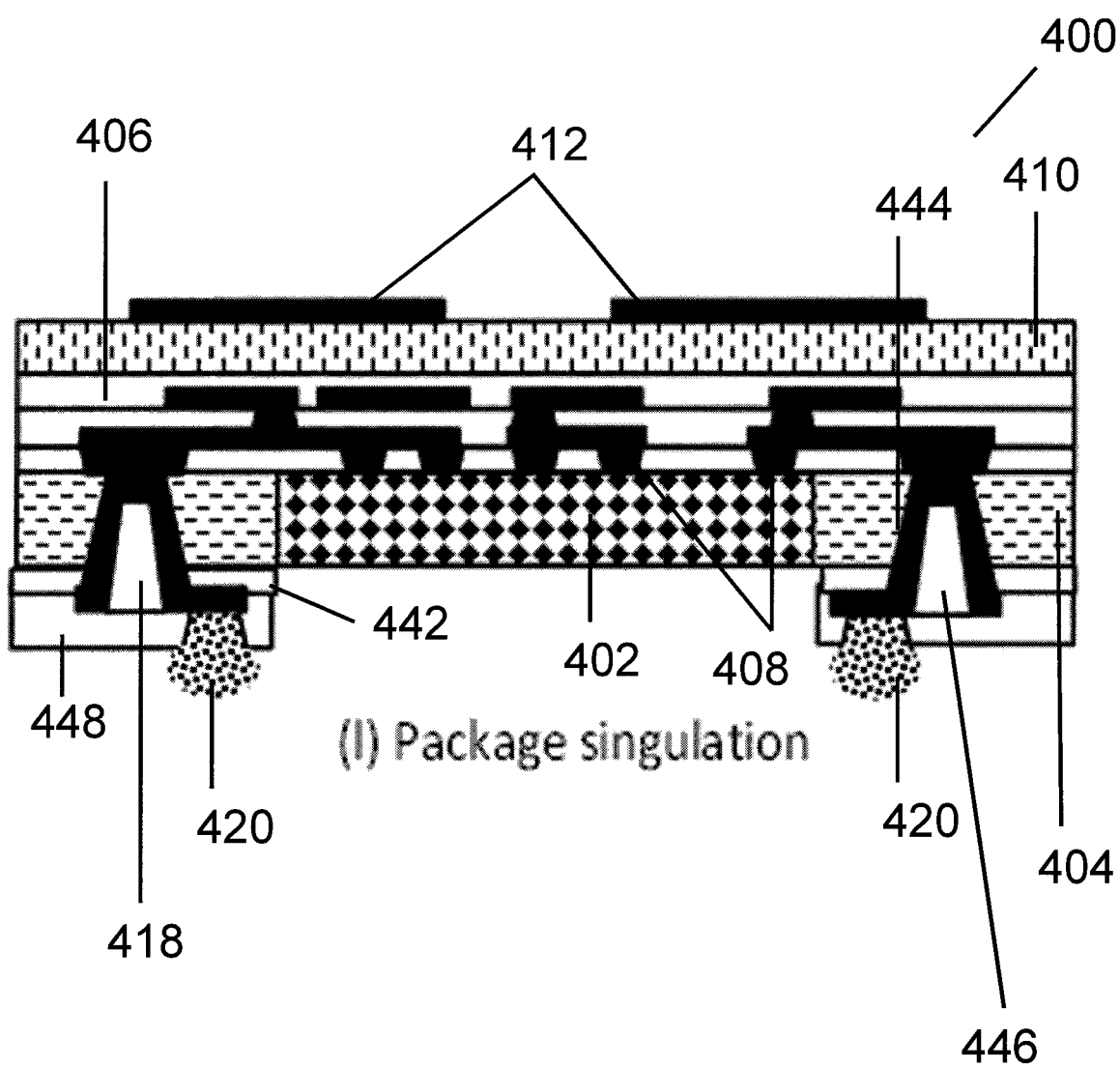
FIG. 4L shows singulation of the wafer to form packages according to various embodiments.
Figure 4M:
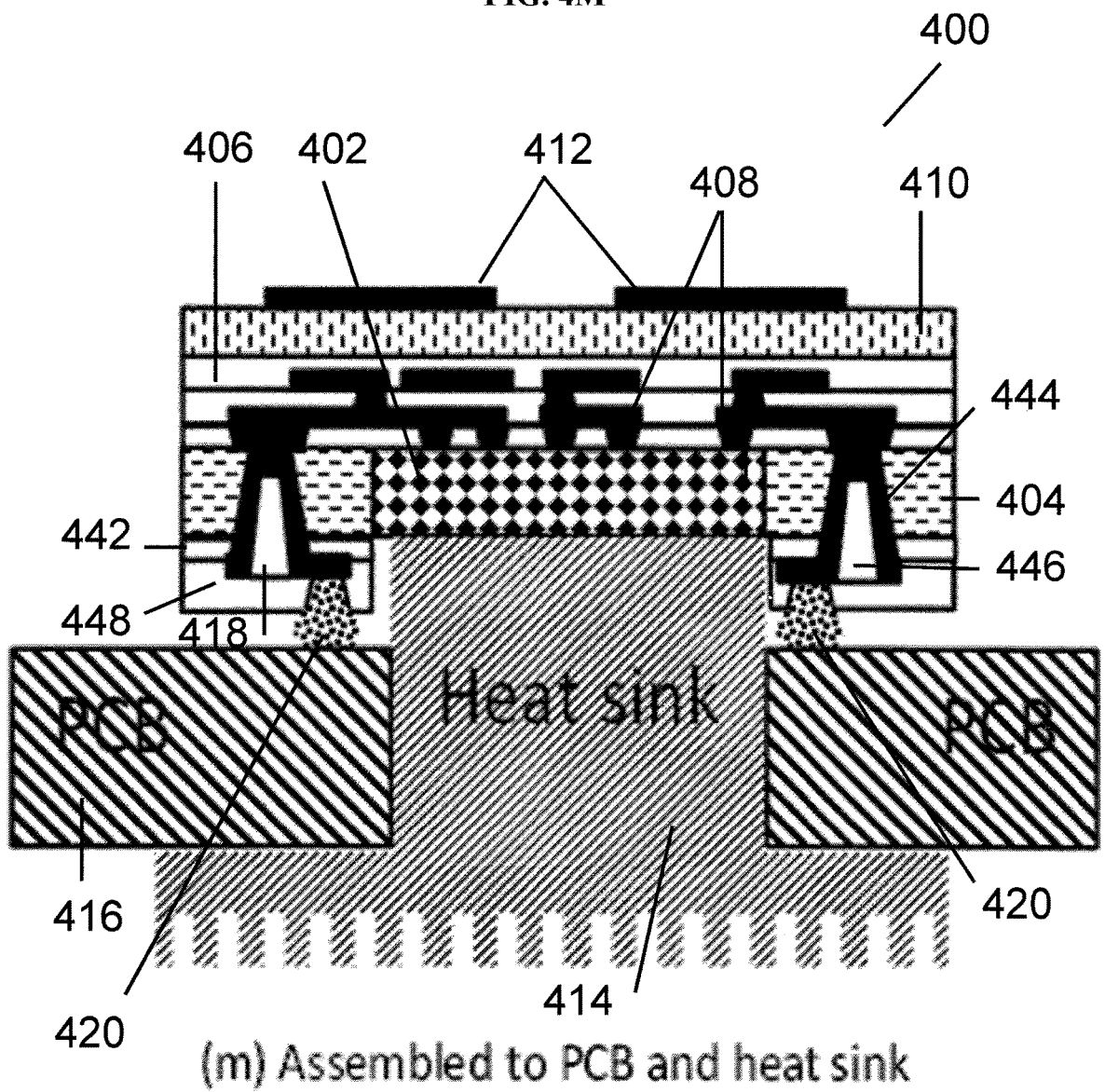
FIG. 4M shows assembling a package to a printed circuit board (PCB) and attaching a heat sink according to various embodiments.
Figure 4N:
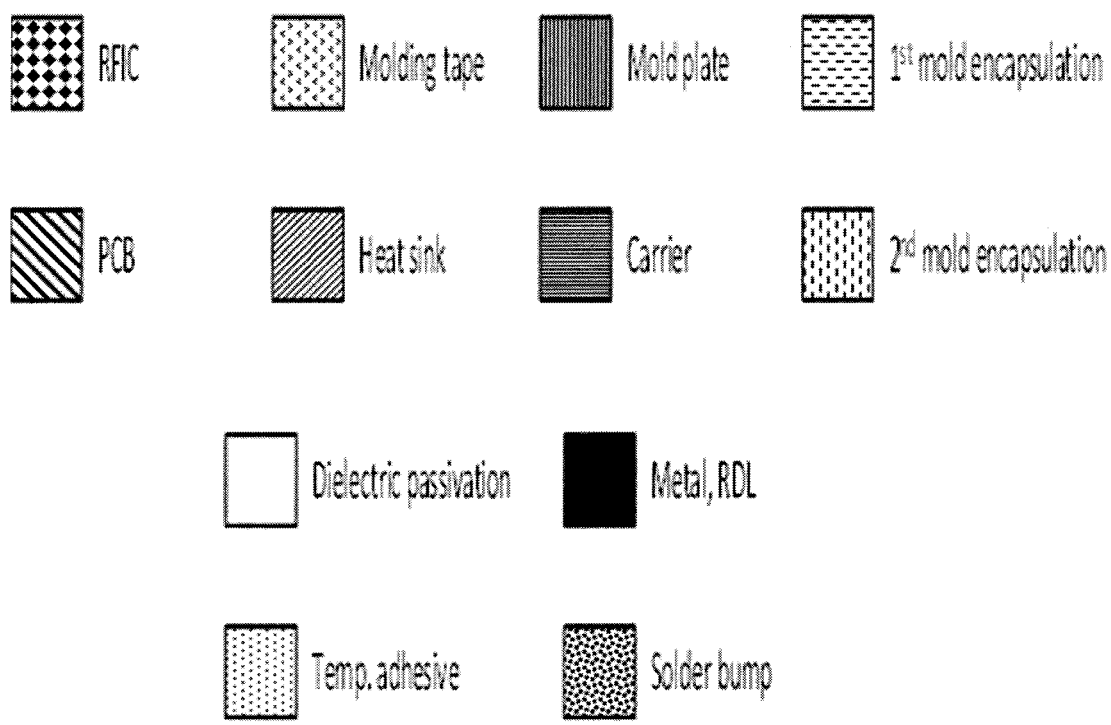
FIG. 4N shows a legend used in FIGS. 4A-M.

FIG. 4L shows singulation of the wafer to form packages 400 according to various embodiments. FIG. 4M shows assembling a package 400 to a printed circuit board (PCB) 416 and attaching a heat sink 414 according to various embodiments. The heat sink 414 may be attached to an exposed backside of the chip 402 with thermal interface material. The antenna array 412 may be on a first side of the chip 402, and the heat sink 414 may be on a second side of the chip 402 opposite the first side. In other words, the chip 402 may be between the antenna array 412 and the heat sink 414. For clarity purposes, not all similar elements shown in FIGS. 4A-M have been labelled. FIG. 4N shows a legend used in FIGS. 4A-M.

Various embodiments may relate to the process flow of the wafer-scale package structure 400 with integration of antenna array and thermal cooling structure. The antenna array 412 and thermal cooling structure 414 may be arranged at the opposite side of the package 400 to minimize the interference between them. The thermal cooling structure 414 may be designed in multiple interleaved fins/fillers configuration so as to reduce the thermal stress induced onto the chip 402 and solder bumps 420, without compromising the heat dissipation performance. The package 400 may be applicable to the millimeter wave wireless system.

Various embodiments may relate to a wafer-scale package structure integrated with antenna array and thermal cooling structure for millimeter wave wireless applications. An antenna array may be built on top of the top mold compound layer while intermediate metal layers in the package between the two mold compound layers may be used for signal routing. Coupling between the antenna array and the signal routing layers may be carried out either inductively or capacitively without any physical connections. The height of the top mold compound and the aperture opening dimension may be used to control the coupling to antenna array for performance improvement. The antenna array may be directional and signal routing layers may be shielded, thus having minimum crosstalk amongst them. Moreover, a thermal cooling structure may be attached to the backside of the chip for heat dissipation. The cooling structure may be located at the opposite side of the package, not on the radiating side of the antenna array. As a result, the thermal cooling structure may not affect the antenna array performance. Thermal stress issue induced by the thermal cooling structure onto the chip and solder bumps may be considered. Directly-contacted filler/fin structure, convection fin and inserted spreading fins may be implemented in the thermal cooling structure. The gaps between multiple contact fins may be filled with high thermal conductivity material with low coefficient of thermal expansion to reduce thermal stress without compromising thermal cooling performance. To enlarge the convection area, multiple spreading pads may placed to interface with convection fins. Various embodiments may also relate to the wafer-level fabrication process flow of the above-mentioned package structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor package comprising:
   a semiconductor chip;
   a first mold compound layer at least partially covering the semiconductor chip;
   a redistribution layer over the first mold compound layer, the redistribution layer comprising one or more electrically conductive lines in electrical connection with the semiconductor chip;
   a second mold compound layer over the redistribution layer; and
   an antenna array over the second mold compound layer, the antenna array configured to be coupled to the one or more electrically conductive lines;
   a thermal cooling structure in thermal contact with the semiconductor chip, the coupling between the one or more electrically conductive lines and the antenna array being inductive coupling or capacitive coupling;
   wherein the antenna array is physically isolated from the one or more electrically conductive lines;
   wherein the semiconductor chip is configured to transmit one or more first electrical signals to the one or more conductive lines so that the antenna array emit one or more first wireless signals in response to the one or more first electrical signals;
   wherein the semiconductor chip is further configured to receive one or more second electrical signals from the one or more first conductive lines in response to the antenna array receiving one or more second wireless signals;
   wherein the semiconductor chip comprises one or more die electrical contacts on a first planar surface of the semiconductor chip;
   wherein the one or more electrically conductive lines are in contact with the one or more die electrical contacts;
   wherein the thermal cooling structure is in contact with a second planar surface of the semiconductor chip opposite the first planar surface;
   wherein the redistribution layer comprises a plurality of further electrically conductive lines;
   wherein the semiconductor package further comprises a plurality of mold layer electrical contacts on a first surface of the first mold compound layer opposite a second surface of the first mold compound layer in contact with the redistribution layer; and
   wherein the semiconductor package also comprises one or more through mold vias extending from the first surface of the first mold compound layer to the second surface of the first mold compound layer, the one or more through mold vias configured to electrically couple the plurality of further electrically conductive lines with the one or more mold layer electrical contacts.

2. The semiconductor package according to claim 1,
   wherein the thermal cooling structure comprises a plurality of contact fins in contact with the semiconductor chip.

3. The semiconductor package according to claim 2,
   wherein the thermal cooling structure further comprises a plurality of convection fins in thermal contact with the plurality of the contact fins.

4. The semiconductor package according to claim 3,
   wherein the thermal cooling structure further comprises a lateral plate having a first surface in contact with the plurality of contact fins, and a second surface in contact with the plurality of convection fins.

5. The semiconductor package according to claim 4,
   wherein the thermal cooling structure further comprises one or more spreading pads in thermal contact with the plurality of the convection fins.

6. The semiconductor package according to statement 5,
   wherein the one or more spreading pads extend substantially perpendicular to the plurality of convection fins.

7. The semiconductor package according to claim 2,
   wherein the thermal cooling structure further comprises a thermal filler between the plurality of contact fins.

8. The semiconductor package according to claim 1,
   wherein the redistribution layer further comprises one or more dielectric layers at least partially covering the one or more electrically conductive lines.

9. The semiconductor package according to claim 1, further comprising:
   a substrate; and
   one or more solder elements, each solder element connecting one of the one or more mold layer electrical contacts with the substrate.

10. The semiconductor package according to claim 1, further comprising:
    wherein the redistribution layer comprises one or more ground plates in electrical connection with one or more of the plurality of further electrically conductive lines.

11. The semiconductor package according to claim 10,
    wherein each of the one or more ground plates comprises an aperture.

12. The semiconductor package according to claim 11,
    wherein the antenna array comprises a plurality of patch elements; and
    wherein the aperture is over a corresponding electrically conductive line of the plurality of conductive lines so that the aperture is between the corresponding electrically conductive line and a corresponding patch element of the plurality of patch elements.

13. The semiconductor package according to claim 12, wherein a distance between the corresponding electrically conductive line and a plane formed by the ground plate is less than 10 μm.

14. The semiconductor package according to claim 1, wherein a thickness of the second mold compound layer is more than 50 μm.

15. A method of forming a semiconductor package, the method comprising:

providing a semiconductor chip;

forming a first mold compound layer at least partially covering the semiconductor chip;

forming a redistribution layer over the first mold compound layer, the redistribution layer comprising one or more electrically conductive lines in electrical connection with the semiconductor chip;

forming a second mold compound layer over the redistribution layer;

forming an antenna array over the second mold compound layer, the antenna array configured to be coupled to the one or more electrically conductive lines, the coupling between the one or more electrically conductive lines and the antenna array being inductive coupling or capacitive coupling; and providing a thermal cooling structure in thermal contact with the semiconductor chip;

wherein the antenna array and the thermal cooling structure are provided on different sides of the package;

wherein the antenna array is physically isolated from the one or more electrically conductive lines;

wherein the semiconductor chip is configured to transmit one or more first electrical signals to the one or more conductive lines so that the antenna array emit one or more first wireless signals in response to the one or more first electrical signals;

wherein the semiconductor chip is further configured to receive one or more second electrical signals from the one or more first conductive lines in response to the antenna array receiving one or more second wireless signals;

wherein the redistribution layer comprises a plurality of further electrically conductive lines;

wherein the semiconductor package further comprises a plurality of mold layer electrical contacts on a first surface of the first mold compound layer opposite a second surface of the first mold compound layer in contact with the redistribution layer; and wherein the semiconductor package also comprises one or more through mold vias extending from the first surface of the first mold compound layer to the second surface of the first mold compound layer, the one or more through mold vias configured to electrically couple the plurality of further electrically conductive lines with the one or more mold layer electrical contacts.

* * * * *